(12) United States Patent
Ha et al.

(10) Patent No.: US 9,905,813 B2
(45) Date of Patent: Feb. 27, 2018

(54) ORGANIC LIGHT-EMITTING DISPLAY DEVICE, ORGANIC LAYER DEPOSITING APPARATUS, AND METHOD OF MANUFACTURING ORGANIC LIGHT-EMITTING DISPLAY DEVICE USING THE ORGANIC LAYER DEPOSITING APPARATUS

(71) Applicant: SAMSUNG DISPLAY CO., LTD., Yongin-si, Gyeonggi-do (KR)

(72) Inventors: Jaesoo Ha, Yongin-si (KR); Minsoo Kim, Yongin-si (KR); Mugyeom Kim, Yongin-si (KR); Muhyun Kim, Yongin-si (KR); Dongkyu Lee, Yongin-si (KR); Byungkook Lee, Yongin-si (KR); Suhwan Lee, Yongin-si (KR); Yonggu Lee, Yongin-si (KR); Jaeyoung Cho, Yongin-si (KR); Valeriy Prushinskiy, Yongin-si (KR)

(73) Assignee: SAMSUNG DISPLAY CO., LTD., Yongin-si, Gyeonggi-do (KR)

(*) Notice: Subject to any disclaimer, the term of this patent is extended or adjusted under 35 U.S.C. 154(b) by 16 days.

(21) Appl. No.: 15/164,922

(22) Filed: May 26, 2016

(65) Prior Publication Data
US 2016/0380240 A1 Dec. 29, 2016

(30) Foreign Application Priority Data

Jun. 29, 2015 (KR) .................. 10-2015-0092027
Nov. 2, 2015 (KR) .................. 10-2015-0153264

(51) Int. Cl.
H01L 51/56 (2006.01)
H01L 51/00 (2006.01)
(Continued)

(52) U.S. Cl.
CPC .......... *H01L 51/56* (2013.01); *B05B 13/0221* (2013.01); *B05B 15/0437* (2013.01);
(Continued)

(58) Field of Classification Search
None
See application file for complete search history.

(56) References Cited

U.S. PATENT DOCUMENTS

2003/0232563 A1 12/2003 Kamiyama et al.
2007/0178708 A1 8/2007 Ukigaya
(Continued)

FOREIGN PATENT DOCUMENTS

JP 2003-157973 A 5/2003
JP 2011-181208 A 9/2011
(Continued)

*Primary Examiner* — Lex Malsawma
(74) *Attorney, Agent, or Firm* — Lee & Morse, P.C.

(57) ABSTRACT

An organic layer depositing apparatus includes a deposition unit which includes one or more deposition assemblies spaced a predetermined distance apart from a substrate to deposit a deposition material on the substrate, wherein the one or more deposition assemblies include: a deposition source; a deposition source nozzle unit; a first pattern sheet which includes a first patterning unit and a first overlap unit; and a second pattern sheet which includes a second patterning unit and a second overlap unit, wherein the first and second pattern sheets are arranged such that the first and second overlap units overlap each other.

20 Claims, 14 Drawing Sheets

(51) Int. Cl.
    *H01L 21/677* (2006.01)
    *H01L 27/32* (2006.01)
    *B05B 15/04* (2006.01)
    *B05B 13/02* (2006.01)
    *H01L 27/12* (2006.01)
(52) U.S. Cl.
    CPC .... *H01L 21/67742* (2013.01); *H01L 27/3248* (2013.01); *H01L 27/3262* (2013.01); *H01L 51/001* (2013.01); *H01L 27/1214* (2013.01)

(56) References Cited

U.S. PATENT DOCUMENTS

| | | |
|---|---|---|
| 2009/0181163 A1 | 7/2009 | Uetake |
| 2009/0220691 A1 | 9/2009 | Kim |
| 2010/0297349 A1 | 11/2010 | Lee et al. |
| 2011/0033964 A1* | 2/2011 | Oh .................. C23C 14/042 438/34 |
| 2011/0053300 A1* | 3/2011 | Ryu ................. C23C 14/042 438/34 |
| 2011/0165327 A1 | 7/2011 | Park et al. |
| 2011/0168986 A1* | 7/2011 | Lee .................. C23C 14/042 257/40 |
| 2012/0103253 A1* | 5/2012 | Park ................. C23C 14/042 118/301 |
| 2012/0145076 A1 | 6/2012 | Shin et al. |
| 2012/0299016 A1* | 11/2012 | Choi ................ C23C 14/042 257/79 |
| 2014/0034917 A1* | 2/2014 | Lee .................. H01L 51/56 257/40 |
| 2015/0159267 A1* | 6/2015 | Ochi ................ C23C 14/042 118/721 |

FOREIGN PATENT DOCUMENTS

| | | |
|---|---|---|
| KR | 10-2009-0093161 A | 9/2009 |
| KR | 10-2010-0133679 A | 12/2010 |
| KR | 10-2011-0082418 A | 7/2011 |
| KR | 10-2012-0066493 A | 6/2012 |
| KR | 10-2012-0131548 A | 12/2012 |
| KR | 10-2015-0036334 A | 4/2015 |

* cited by examiner

ORGANIC LIGHT-EMITTING DISPLAY DEVICE, ORGANIC LAYER DEPOSITING APPARATUS, AND METHOD OF MANUFACTURING ORGANIC LIGHT-EMITTING DISPLAY DEVICE USING THE ORGANIC LAYER DEPOSITING APPARATUS

CROSS-REFERENCE TO RELATED APPLICATION

Korean Patent Application Nos. 10-2015-0092027, filed on Jun. 29, 2015, and 10-2015-0153264, filed on Nov. 2, 2015, in the Korean Intellectual Property Office, and entitled: "Organic Light-Emitting Display Device, Organic Layer Depositing Apparatus, and Method of Manufacturing Organic Light-Emitting Display Device Using the Organic Layer Depositing Apparatus," is incorporated by reference herein in its entirety.

BACKGROUND

1. Field

Exemplary embodiments relate to apparatuses and methods, and more particularly, to an organic light-emitting display device, an organic layer depositing apparatus, and a method of manufacturing the organic light-emitting display device using the organic layer depositing apparatus.

2. Description of the Related Art

An organic light-emitting display device may have a wide viewing angle, excellent contrast, and a fast response time.

Organic light-emitting devices include a first electrode, a second electrode opposite to the first electrode, and an intermediate layer disposed between the first electrode and the second electrode and including an emission layer. The first electrode, the second electrode, and the intermediate layer are formed by using various methods.

SUMMARY

Exemplary embodiments may include an organic light-emitting display device, an organic layer depositing apparatus, and a method of manufacturing the organic light-emitting display device using the organic layer depositing apparatus.

According to exemplary embodiments, an organic layer depositing apparatus may include a deposition unit including one or more deposition assemblies spaced a predetermined distance apart from a substrate to deposit a deposition material on the substrate, wherein the one or more deposition assemblies comprise: a deposition source that sprays the deposition material; a deposition source nozzle unit on the deposition source and in which deposition source nozzles are disposed; a first pattern sheet disposed to face the deposition source nozzle unit and including a first patterning unit and a first overlap unit, the first patterning unit defining a first patterning slit through which the deposition material passes, and the first overlap unit being connected to the first patterning unit and defining a first overlap patterning slit through which the deposition material passes; and a second pattern sheet disposed to face the deposition source nozzle unit and including a second patterning unit and a second overlap unit, the second patterning unit defining a second patterning slit through which the deposition material passes, and the second overlap unit being connected to the second patterning unit and defining a second overlap patterning slit through which the deposition material passes, and wherein the first and second pattern sheets are arranged such that the first and second overlap units overlap each other.

The first and second patterning units may be spaced apart from each other such that the deposition material passes through the first and second patterning units and is respectively deposited on different regions of the substrate.

At least a portion of the first overlap patterning slit may overlap at least a portion of the second overlap patterning slit.

The sum of areas in the overlapping portions of the first and second overlap patterning slits may correspond to an area of the first patterning slit or the second patterning slit.

A length of the first patterning slit may be different from a length of the first overlap patterning slit.

A length of the first overlap patterning slit may be less than a length of the first patterning slit.

A length of the second patterning slit may be different from a length of the second overlap patterning slit.

A length of the second overlap patterning slit may be less than a length of the second patterning slit.

The first or second overlap patterning slit may be a plurality of overlap patterning slits, and lengths of the plurality of the first overlap patterning slits or the plurality of the second overlap patterning slits may be gradually linearly shortened toward an end portion of the first pattern sheet or the second pattern sheet, respectively.

The organic layer depositing apparatus may further include an overlap correcting plate disposed on at least one of the first and second pattern sheets to adjust a length of each of the first and second overlap patterning slits. The first and second pattern sheets may be opened An entire area of the overlap correcting plate may correspond to an area of the first overlap unit or the second overlap unit.

At least one of the first and second pattern sheets, the deposition source, and the deposition source nozzle unit may be connected through a connection unit and may be integrally formed.

The organic layer depositing apparatus may further include a transfer unit including: a first transfer unit that transfers a moving unit in a first direction in which the deposition material is deposited, the substrate being detachably fixed to the moving unit; and a second transfer unit that transfers the moving unit when the substrate has been separated therefrom in a second direction opposite to the first direction, the transfer unit allowing the moving unit to be cyclically transferred by the first and second transfer units.

According to exemplary embodiments, a method of manufacturing an organic light-emitting display device by using an organic layer depositing device configured to deposit an organic layer on a substrate may include: fixing the substrate to a moving unit in a loading unit; transferring the moving unit to which the substrate is fixed to a chamber by using a first transfer unit disposed to penetrate through the chamber; forming an organic layer by depositing a deposition material on different regions of the substrate, the deposition material being sprayed from a deposition source nozzle unit of a deposition assembly while the substrate is relatively moved with respect to the deposition assembly, the substrate and the deposition assembly being disposed in the chamber and spaced apart from each other, the substrate passing through first and second pattern sheets, and the first and second pattern sheets being spaced apart from each other; separating the substrate from the moving unit in an unloading unit when the depositing is completed; and transferring the moving unit from which the substrate is separated to the loading unit by using a second transfer unit disposed to penetrate through the chamber, wherein the first pattern sheet is disposed to face the deposition source nozzle unit and includes a first patterning unit and a first overlap unit, the first patterning unit defining a first patterning slit through which the deposition material passes, and the first overlap unit being connected to the first patterning unit and defining a first overlap patterning slit through which the deposition material passes; the second pattern sheet is disposed to face the deposition source nozzle unit and includes a second patterning unit and a second overlap unit, the second patterning unit defining a second patterning slit through which the deposition material passes, and the second overlap unit being connected to the second patterning unit and defining a second overlap patterning slit through which the deposition material passes; and the first and second pattern sheets are arranged such that the first and second overlap units overlap each other.

The first and second patterning units may be spaced apart from each other such that the deposition material passes through the first and second patterning units and is respectively deposited on different regions of the substrate.

A first organic layer may be deposited on the substrate by passing the deposition material through the first overlap patterning slit, and a second organic layer may be deposited on the first organic layer by passing the deposition material through the second overlap patterning slit.

The sum of a thickness of a first organic layer and a thickness of a second organic layer may correspond to a thickness of an organic layer deposited through the first patterning slit or the second patterning slit, the first organic layer being deposited on the substrate through the first overlap patterning slit, and the second organic layer being deposited on the first organic layer through the second overlap patterning slit.

The deposition assembly may form a pattern layer on the substrate.

At least a portion of the organic layer deposited on the substrate through the first overlap patterning slit may overlap at least a portion deposited on the substrate through the second overlap patterning slit.

According to exemplary embodiments, an organic light-emitting device may include: a substrate; at least one thin film transistor on the substrate including a semiconductor active layer, a gate electrode insulated from the semiconductor active layer, and source and drain electrodes, each of the source and drain electrodes coming into contact with the semiconductor active layer; a plurality of pixel electrodes on the thin film transistor; a plurality of organic layers on the plurality of pixel electrodes; and a plurality of counter electrodes on the plurality of organic layers, wherein at least one of the plurality of organic layers on the substrate is formed using the organic layer depositing apparatus of as claimed in any one of the above-described organic layer depositing apparatuses.

BRIEF DESCRIPTION OF THE DRAWINGS

Features will become apparent to those of ordinary skill in the art by describing in detail exemplary embodiments with reference to the attached drawings in which:

FIGS. 11 and 11A illustrate plan views of another modification of FIG. 6;

FIGS. 13 and 13A illustrate plan views of another modification of FIG. 6;

FIGS. 14 and 14A illustrate plan views of another modification of FIG. 6; and

DETAILED DESCRIPTION

Figure 1:
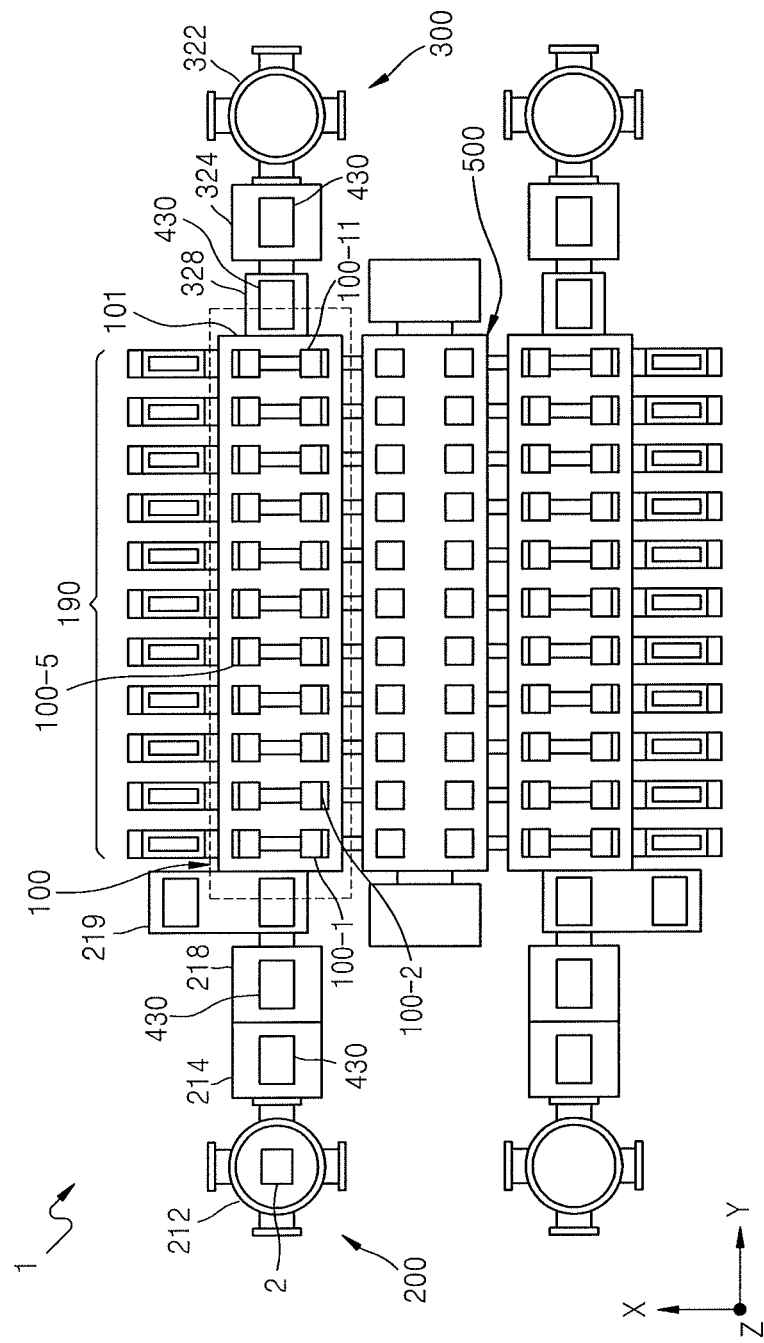
FIG. 1 illustrates a plan view of an organic layer depositing apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

As used herein, the term "and/or" includes any and all combinations of one or more of the associated listed items. Expressions such as "at least one of" or "at least one selected from" when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

Hereinafter, exemplary embodiments will be described in detail with reference to the accompanying drawings. Like reference numerals refer to like elements throughout.

Figure 2:
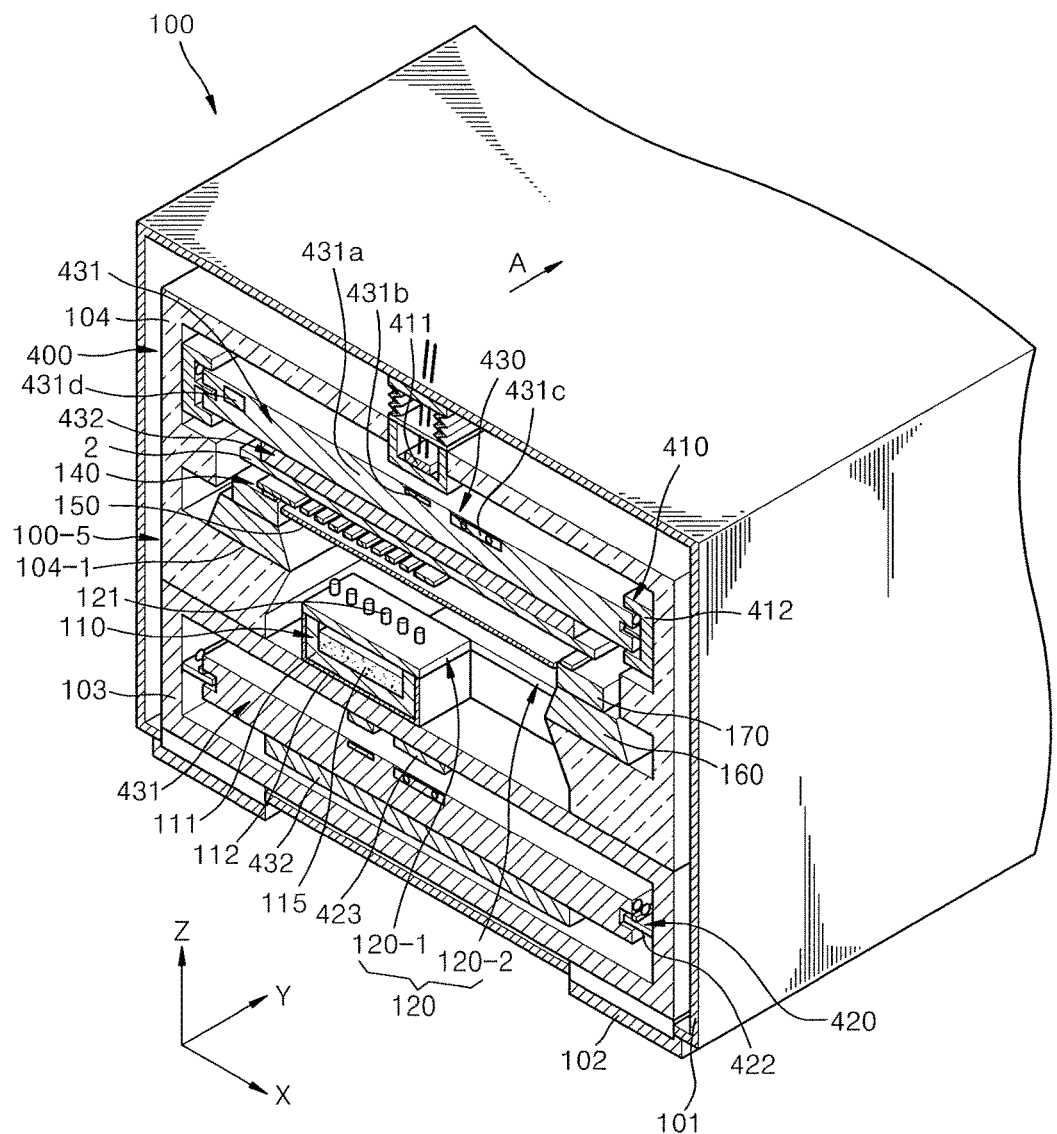
FIG. 2 illustrates a perspective cross-sectional view of a portion of a deposition unit in the organic layer depositing apparatus illustrated in FIG. 1.
Figure 3:
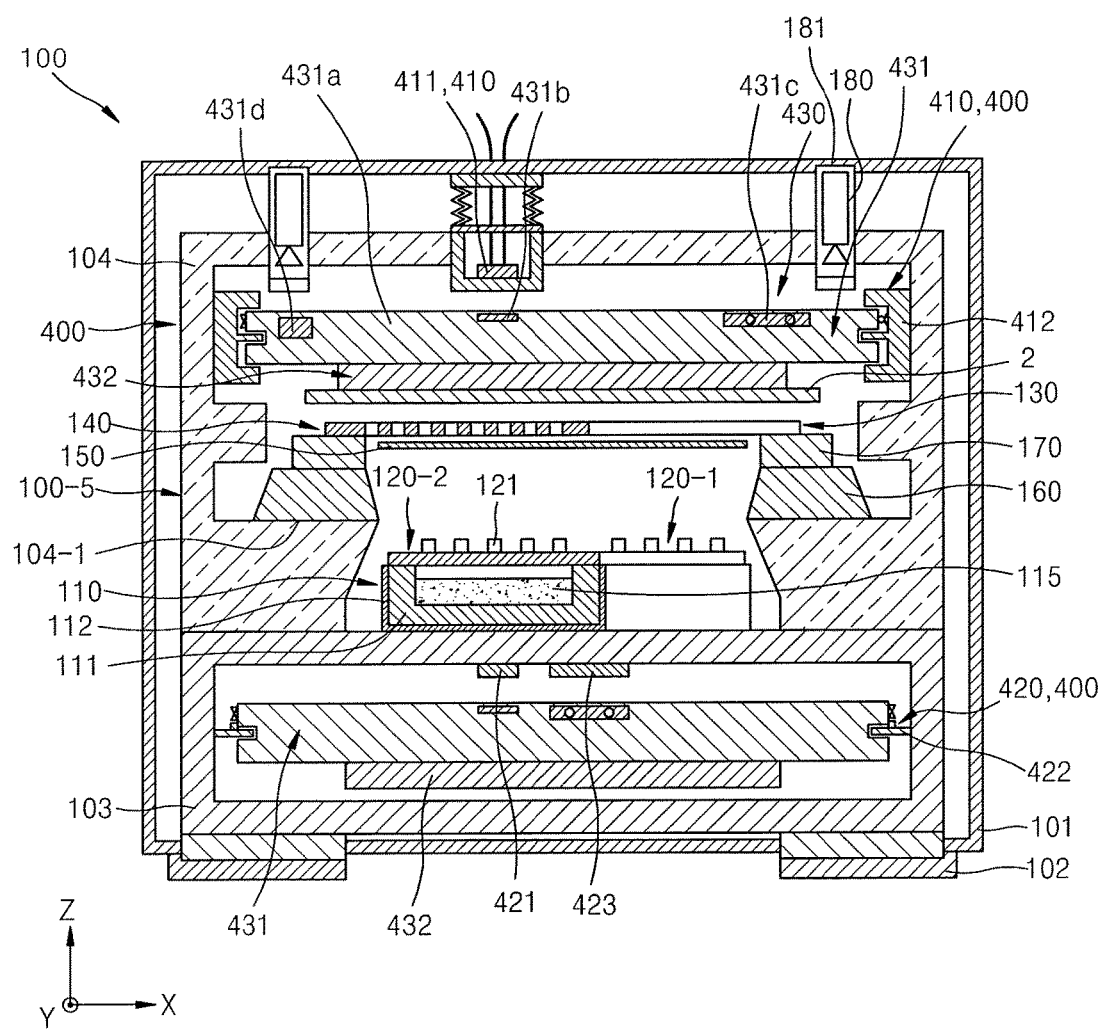
FIG. 3 illustrates a cross-sectional view of a portion of the deposition unit in the organic layer depositing apparatus illustrated in FIG. 1.

FIG. 1 is a plan view of an organic layer depositing apparatus 1 according to an exemplary embodiment. FIG. 2 is a perspective cross-sectional view of a portion of a deposition unit 100 in the organic layer depositing apparatus 1 illustrated in FIG. 1. FIG. 3 is a cross-sectional view of a portion of the deposition unit 100 in the organic layer depositing apparatus 1 illustrated in FIG. 1.

Referring to FIGS. 1 to 3, the organic layer depositing apparatus 1 may include the deposition unit 100, a loading unit 200, an unloading unit 300, and a transfer unit 400.

The loading unit 200 may include a first rack 212, an introduction chamber 214, a first inversion chamber 218, and a buffer chamber 219.

A plurality of substrates 2, on which deposition is to be performed, may be loaded on the first rack 212. An introduction robot disposed in the introduction chamber 214 may grasp the substrate 2 on the first rack 212, may place the grasped substrate 2 on a moving unit 430 moved from a second transfer unit 420, and may move the moving unit 430 on which the substrate 2 is placed to the first inversion chamber 218.

The first inversion chamber 218 may be adjacent to the introduction chamber 214. A first inversion robot disposed in the first inversion chamber 218 may invert the moving unit 430 and may mount the moving unit 430 on a first transfer unit 410 of the deposition unit 100.

Referring to FIG. 1, the introduction robot of the introduction chamber 214 may place the substrate 2 on an upper surface of the moving unit 430. In this state, the first moving unit 430 may be moved to the inversion chamber 218. As the first inversion robot of the inversion chamber 218 inverts the inversion chamber 218, the substrate 2 may be turned upside down in the deposition unit 100.

The unloading unit 300 may be configured to operate in an opposite manner to the loading unit 200 described above. That is, a second inversion robot may invert the substrate 2 and the moving unit 430, which pass through the deposition unit 100, and may transfer the substrate 2 and the moving unit 430 to an ejection chamber 324. An ejection robot may eject the substrate 2 and the moving unit 430 from the ejection chamber 324, may separate the substrate 2 from the moving unit 430, and may load the separated substrate 2 on a second rack 322. The moving unit 430, from which the substrate 2 is separated, may be retransferred to the loading unit 200 through the second transfer unit 420.

Exemplary embodiments are not necessarily limited thereto. In a state of being fixed to a lower surface of the moving unit 430 from when initially fixed to the moving unit 430, the substrate 2 may be directly transferred to the deposition unit 100. In this example, the first inversion robot of the first inversion chamber 218 and the second inversion robot of the second inversion chamber 328 are not required.

The deposition unit 100 may include at least one chamber 101 for depositing. According to the exemplary embodiment illustrated in FIGS. 1 and 2, the deposition unit 100 may include the chamber 101, and a plurality of deposition assemblies 100-1, 100-2, . . . 100-n may be disposed in the chamber 101. According to the exemplary embodiment illustrated in FIG. 1, eleven deposition assembles 100-1 to 100-11 may be disposed in the chamber 101, for example, but the number of the deposition assemblies 100-1 and 100-11 may be varied according to a deposition material and a deposition condition. The chamber 101 may be maintained in vacuum while the deposition is performed.

According to the exemplary embodiment illustrated in FIG. 1, the moving unit 430, to which the substrate 2 is fixed, may be moved at least to the deposition unit 100 by the transfer unit 410 or may be sequentially moved to the loading unit 200, the deposition unit 100, and the unloading unit 300 by the first transfer unit 410. The moving unit 430, from which the substrate 2 is separated in the unloading unit 300, may be retransferred to the loading unit 200 by the second transfer unit 420.

The first transfer unit 410 may be disposed to penetrate through the chamber 101 when passing through the deposition unit 100. The second transfer unit 420 may be disposed to transfer the moving unit 430 from which the substrate 2 is separated.

In the organic layer depositing apparatus 1 according to exemplary embodiments, the deposition is completed while the moving unit 430 passes through the first transfer unit 410. Since the first and second transfer units 410 and 420 are respectively disposed up and down, after the moving unit 430 is separated from the substrate 2 in the unloading unit 300, the moving unit 430 may be retransferred to the loading unit 200 through the second transfer unit 420 disposed under the first transfer unit 410, thereby obtaining an effect of improving space using efficiency.

The deposition unit 100 of FIG. 1 may further include a deposition source replacement unit 190 disposed at one side of each of the deposition assemblies 100-1 to 100-n (where n is a natural number from 1 to 11, for example). Although not illustrated in detail in FIG. 1, the deposition source replacement unit 190 may be a cassette type so as to be ejected to the outside from each of the deposition assemblies 100-1 to 100-n, for example, a deposition source (see 110 of FIG. 3) of the deposition assembly 100-5.

The organic layer depositing apparatus 1 includes, for example, the loading unit 200, the deposition unit 100, the unloading unit 300, and the transfer unit 400. For example, a series of two sets for constituting the organic layer depositing apparatus 1 are illustrated in FIG. 1 as being disposed parallel to each other. That is, it may be understood that two organic layer depositing apparatuses 1 are respectively disposed at an upper side and a lower side of FIG. 1.

In this case, a patterning slit sheet replacement unit 500 may be further disposed between the two organic layer depositing apparatuses 1. That is, since the patterning slit sheet replacement unit 500 is disposed between the two organic layer depositing apparatuses 1, the two organic layer depositing apparatuses 1 may share the patterning slit sheet replacement unit 500. Accordingly, space saving efficiency may be improved as compared to a case where each of the two organic layer depositing apparatuses 1 includes a patterning slit sheet replacement unit 500.

Referring to FIGS. 2 to 3, the deposition unit 100 of the organic layer depositing apparatus 1 may include at least one deposition assembly 100-5 and the transfer unit 400.

Hereinafter, an overall configuration of the deposition unit 100 will be described.

The chamber 101 may be a hollow box shape, for example, and at least one deposition assembly 100-5 and the transfer unit 400 may be accommodated in the chamber 101. A foot 102 may be disposed to be fixed to a ground surface, a lower housing 103 may be disposed on the foot 102, and an upper housing 104 may be disposed on the lower housing 103. The chamber 101 may accommodate both of the lower and upper housings 103 and 104. A connection unit between the lower housing 103 and the upper housing 104 may be sealed to allow an inside of the chamber 101 to be fully blocked from the outside.

As described above, since the lower and upper housings 103 and 104 are disposed on the foot 102 which is fixed to the ground surface, the lower and upper housings 103 and 104 may be maintained at a fixed position even when the chamber 101 repeatedly contracts or expands. Accordingly, the lower and upper housings 103 and 104 may function as a kind of a reference frame in the deposition unit 100.

The deposition assembly 100-5 and the first transfer unit 410 of the transfer unit 400 may be disposed in the upper housing 104, and the second transfer unit 420 of the transfer unit 400 may be disposed in the lower housing 103. The deposition may be continuously performed while the moving unit 430 is cyclically moved between the first transfer unit 410 and the second transfer unit 420.

Hereinafter, a detailed configuration of the deposition assembly 100-5 will be described.

The deposition assembly 100-5 may include a deposition source 110, deposition source nozzle units 120 (120-1 and 120-2), a first pattern sheet 130, a second pattern sheet 140, a plurality of source shutters 150, a first stage 160, and a second stage 170. All configurations of FIGS. 3 and 4 may be disposed in the chamber 101 and maintained at an appropriate degree of vacuum. This is to ensure straightness and consistency of a deposition material 115.

The substrate 2, i.e., a deposition target, may be disposed in the chamber 101. The substrate 2 may be, for example, a substrate for a flat panel display device and may be, for example, a large-sized substrate capable of manufacturing a flat panel display device having a large screen of about 40 inches or more.

As the substrate 2 is relatively moved with respect to the deposition assembly 100-5, the deposition may be performed.

Specifically, in a conventional fine metal mask (FMM) deposition, it is necessary to form a FMM to have a size equal to a size of a substrate. As the size of the substrate is increased, it is necessary to increase the size of the FMM. Accordingly, there are limitations in that it is not easy to manufacture the FMM, and it is not easy to tension and align the FMM in precise patterns.

In order to overcome these limitations, the deposition assembly 100-5 and the substrate 2 are relatively moved with respect to each other, the deposition is performed. In other words, as the substrate 2 facing the deposition assembly 100-5 is moved in a Y-axis direction, the deposition may be continuously performed. That is, as the substrate 2 is moved in a direction of an arrow A of FIG. 4, the deposition may be performed in a scanning type, for example.

Figure 4:
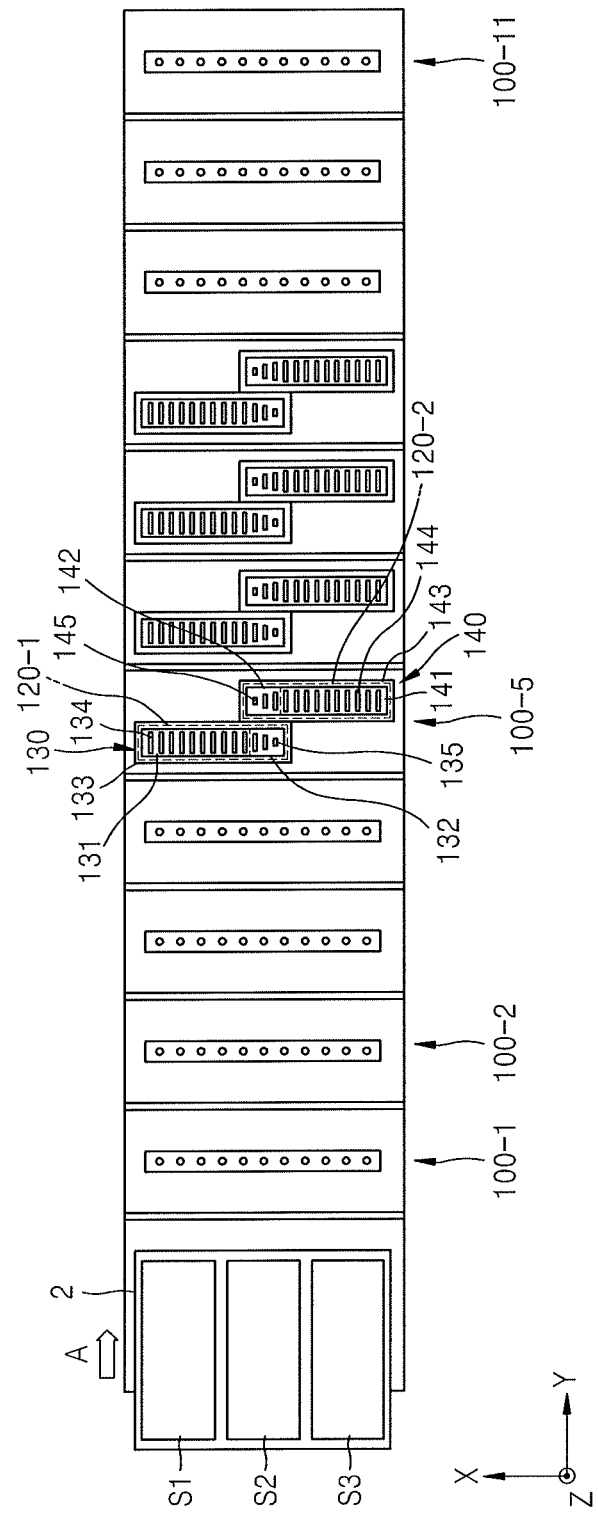
FIG. 4 illustrates a conceptual diagram for describing an arrangement of a deposition source and first and second pattern sheets in the organic layer depositing apparatus illustrated in FIG. 1.

The deposition is illustrated in FIG. 4 as being performed while the substrate 2 is moved in the Y-axis direction in the chamber 101. However, exemplary embodiments are not limited thereto, and the deposition may be performed in a state in which the substrate 2 is fixed, and the deposition assembly 100-5 is moved in the Y-axis direction.

In the case of the deposition assembly 100-5, the first and second pattern sheets 130 and 140 may be manufactured to be much smaller as compared to a conventional FMM. That is, in the case of the deposition assembly 100-5, since the deposition is continuously performed, i.e., in a scanning type as the substrate 2 is moved in the Y-axis direction, a length of at least one of an X-axis direction and the Y-axis direction in the first pattern sheet 130 or the second pattern sheet 140 may be less than a length of the substrate 2.

As described above, the first and second pattern sheets 130 and 140 may be manufactured to be much smaller as compared to the conventional FMM and the first and second pattern sheets 130 and 140 may be easy to manufacture. That is, in all processes such as, for example, an etching process, a tensile-welding process, a transfer process, and a washing process for the first and second pattern sheets 130 and 140, the first and second pattern sheets 130 and 140 having a small size may be more suitable as compared to the FMM deposition. In addition, as an organic light-emitting display device (see 10 of FIG. 15) becomes larger, the first and second pattern sheets 130 and 140 having the small size may be more suitable.

As described above, in order for the deposition to be performed as the deposition assembly 100-5 and the substrate 2 are moved with respect to each other, the deposition assembly 100-5 and the substrate 2 may be spaced apart from each other. This will be described in detail later.

The deposition source 110 which receives and heats the deposition material 115 may be disposed at a side opposite to the substrate 2 in the chamber 101. As the deposition material 115 that is received in the deposition source 110 is evaporated, the deposition may be performed on the substrate 2.

The deposition source 110 may include a crucible 111 filled with the deposition material 115 and a heater 112 configured to heat the crucible 111 and evaporate the deposition material 115 that fills the crucible 111 toward one side of the crucible 111, for example, toward the deposition source nozzle units 120 (120-1 and 120-2).

The deposition source nozzle units 120 (120-1 and 120-2) may be disposed at one side of the deposition source 110, for example, at a side that faces the substrate 2 from the deposition source 110. In the deposition assembly 100-5, deposition source nozzles 121 may be formed to be different from one another in a case where a common layer and a pattern layer are deposited, for example.

The first and second pattern sheets 130 and 140 may be disposed between the deposition source 110 and the substrate 2. The first and second pattern sheets 130 and 140 will be described in detail below.

The deposition material 115 that is evaporated in the deposition source 110 may pass through the deposition source nozzle units 120 (120-1 and 120-2) and the first and second pattern sheets 130 and 140 and may be moved toward the substrate 2, i.e., the deposition target. The first and second pattern sheets 130 and 140 may be manufactured through an etching method that is substantially the same as a conventional method of manufacturing a FMM, for example, a stripe-typed mask. However, exemplary embodiments are not limited thereto, and the first and second pattern sheets 130 and 140 may be manufactured by, for example, an electro-forming method, a laser patterning method, or the like.

The first and second pattern sheets 130 and 140 may be spaced apart from the deposition source 110 and the deposition source nozzle units 120 (120-1 and 120-2) coupled to the deposition source 110.

As described above, as the deposition assembly 100-5 is relatively moved with respect to the substrate 2, the deposition may be performed. In order for the deposition assembly 100-5 to be relatively moved with respect to the substrate 2, the first and second pattern sheets 130 and 140 may be spaced a predetermined distance from the substrate 2.

In order to prevent a shadow from being formed on a substrate in the conventional FMM deposition, a deposition process is performed by bringing a mask into close contact with the substrate. However, as described above, when the mask comes into close contact with the substrate, defects are generated due to the contact between the substrate and the mask. In addition, since the mask is not movable with respect to the substrate, it is necessary for the mask to have a size equal to a size of the substrate. Therefore, as the organic light-emitting device 10 becomes larger, it is necessary that the size of the mask is increased. The large-sized mask, however, is not easy to form.

In order to overcome these limitations, in the deposition assembly 100-5 according to the present exemplary embodiment, the first and second pattern sheets 130 and 140 may be spaced a distance apart from the substrate 2 that is the deposition target.

According to exemplary embodiments, as the first and second pattern sheets 130 and 140 are moved with respect to the substrate 2, the deposition may be performed. Thereby the first and second pattern sheets 130 and 140 are much easier to manufacture. In addition, it may be possible to prevent defects caused by contact between the substrate 2 and the first pattern sheets 130 and 140. Furthermore, since it is unnecessary to bring the substrate 2 into close contact with the first and second pattern sheets 130 and 140 during the process, a manufacturing speed may be increased.

A specific placement of configurations in the upper housing 104 may be described as follows.

The deposition source 110 and deposition source nozzle units 120 (120-1 and 120-2) may be disposed on a bottom portion of the upper housing 104. A seating unit 104-1 may protrude toward both sides of the deposition source 110 and the deposition source nozzle units 120. The first stage 160, the second stage 170, and the first and second pattern sheets 130 and 140 may be sequentially disposed on the seating unit 104-1.

The first stage 160 may be disposed to be movable in the X-axis direction and the Y-axis direction and may function to align the first and second pattern sheets 130 and 140 in the X-axis direction and the Y-axis direction. That is, the first stage 160 may include a plurality of actuators and may be disposed to be moved in the X-axis direction and the Y-axis direction with respect to the upper housing 104.

The second stage 170 may be disposed to be movable in a Z-axis direction and may function to align the first and second pattern sheets 130 and 140 in the Z-axis direction. That is, the second stage 170 may include a plurality of actuators and may be disposed to be moved in the Z-axis direction with respect to the first stage 160.

The first and second pattern sheets 130 and 140 may be disposed on the second stage 170. As described above, since the first and second pattern sheets 130 and 140 are disposed on the first and second stages 160 and 170, the first and second pattern sheets 130 may be moved in the X-axis direction, the Y-axis-direction, and the Z-axis direction. Accordingly, an alignment may be performed between the substrate 2 and the first and second pattern sheets 130 and 140.

Furthermore, the upper housing 104, the first stage 160, and the second stage 170 may concurrently function to guide a movement path of the deposition material 115 such that the deposition material 115 sprayed through the deposition source nozzles 121 is not dispersed. That is, since the movement path of the deposition material 115 is closed by the upper housing 104, the first stage 160, and the second stage 170, the movement of the deposition material 115 may be guided to be moved in the X-axis direction and the Y-axis direction at the same time.

The plurality of source shutters 150 may be disposed between the first and second pattern sheets 130 and 140 and the deposition source 110. The plurality of source shutters 150 may function to shut off the deposition material 115 sprayed from the deposition source 110.

Although not illustrated in FIGS. 1 to 3, a blocking member may be disposed in the deposition unit 100 to prevent an organic material from being deposited on a film non-formation region of the substrate 2. Since the blocking member is disposed to be moved together with the substrate 2 in a state in which the blocking member covers an edge portion of the substrate 2, the film non-formation region of the substrate 2 may be covered. Accordingly, it may be possible to easily prevent the organic material from being deposited on the film non-formation region of the substrate 2 without a separate structure.

In addition, although not illustrated in FIGS. 1 to 3, a plurality of source shutter driving units may be further disposed in the deposition unit 100 to respectively move the source shutters 150. At this time, each of the source shutter driving units may include a general motor and a gear assembly and may include a cylinder or the like that linearly moves in one direction. However, the source shutter driving units are not limited thereto and may include all devices configured to linearly move each of the source shutters 150.

Hereinafter, the transfer unit 400 transferring the substrate 2, i.e., the deposition target will be described in detail. Referring to FIGS. 2 to 3, the transfer unit 400 may include the first transfer unit 410, the second transfer unit 420, and the moving unit 430.

In order for an organic layer to be deposited on the substrate 2 by the deposition assembly 100-5, the first transfer unit 410 may function to transfer the moving unit 430 and the substrate 2 in-line. The moving unit 430 may include a carrier 431 and an electrostatic chuck 432 coupled to the carrier 431, and the substrate may be attached to the moving unit 430.

The second transfer unit 420 may function to retransfer the moving unit 430 from which the substrate 2 is separated after the deposition is performed once to the loading unit 200. The second transfer unit 420 may include a coil 421, a roller guide 422, and a charging track 423.

The moving unit 430 may include the carrier 431 and the electrostatic chuck 432 which is coupled on one surface of the carrier 431 and to which the substrate 2 is attached. The carrier 431 may follow the first and second transfer units 410 and 420.

Hereinafter, configurations in the transfer unit 400 will be described in more detail.

The carrier 431 of the moving unit 430 will be described in detail.

The carrier 431 may include a body unit 431a, a linear motion system (LMS) magnet, a contactless power supply (CPS) module 431c, a power supply unit 431d, and guide grooves.

The body unit 431a may constitute a base unit of the carrier 431 and may include a magnetic material such as iron. The carrier 431 may be maintained in a state of being spaced a predetermined distance apart from a guide unit 412 by a magnetic force between the body unit 431a of the carrier 431 and a magnetic levitation bearing.

Guide grooves may be formed at both side surfaces of the body unit 431a, and a guide protrusion of the guide unit 412 may be accommodated in each of the guide grooves.

Magnetic rails 431b may be disposed along a centerline of a travel direction of the body unit 431a. The magnetic rails 431b of the body unit 431a and coils 411, to be described later, may be coupled to each other to constitute a linear motor, and the carrier 431 may be transferred in the direction of the arrow A by the linear motor.

A CPS module 431c and a power supply unit 431d may be disposed at one side of the magnetic rails 431b in the body unit 431a. The power supply unit 431d may be a kind of a rechargeable battery, for example, configured to supply electric power such that the electrostatic chuck 432 chucks the substrate 2 and maintains the chucked state. The CPS module 431c may be a wireless charging module, for example, configured to charge the power supply unit 431d.

The charging track 423 that is disposed in the second transfer unit 420, to be described later, may be connected to an inverter, and when the carrier 431 is transferred in the second transfer unit 420, a magnetic field may be generated between the charging track 423 and the CPS module 431c, and electric power may be supplied to the CPS module 431c. The electric power supplied to the CPS module 431c may charge the power supply unit 431d.

In the electrostatic chuck 432, an electrode, to which electric power is applied, may be buried in a body including ceramic, for example, and the substrate 2 may be attached to a surface of the body by applying a high voltage to the electrode.

A drive of the moving unit 430 will be described in detail.

The magnetic rails 431b of the body unit 431a and the coils 411 may be coupled to each other to constitute a driving unit. The driving unit may be a linear motor. The linear motor may be a device that has very high positioning accuracy due to a low friction coefficient and a very low error occurrence probability as compared to a conventional slide guide system. As described above, the linear motor may include the coils 411 and the magnetic rails 431b. The magnetic rails 431b may be disposed in a line on the carrier 431, and a plurality of coils 411 may be spaced a predetermined distance from one another at one side in the chamber 101 to respectively face the magnetic rails 431b. As described above, since the magnetic rails 431b rather than the coils 411 are disposed on the carrier 431, i.e., a moving body, it may be possible to drive the carrier 431 although electric power is not applied to the carrier 431. The coils 411 may be disposed in an atmosphere (ATM) box and may be installed in an atmospheric condition. The magnetic rails 431b may be attached to the carrier 431 such that the carrier 431 is movable in the chamber 101 and maintained in vacuum.

The deposition assembly 100-5 of the organic layer depositing apparatus 1 may include a camera 180 for aligning. Specifically, the camera 180 may align marks formed on the first and second pattern sheets 130 and 140 and marks formed on the substrate 2 in real time. The camera 180 may be disposed to secure a clear view in the chamber 101 in which the deposition is performed and is maintained in vacuum. To this end, the camera 180 may be accommodated in a camera accommodation unit 181 and may be installed in an atmospheric condition.

The first and second pattern sheets 130 and 140 disposed in the deposition assembly 100-5 will be described in detail with reference to FIGS. 4 and 5.

FIG. 4 is a conceptual diagram for describing an arrangement of the deposition source 110 and the first and second pattern sheets 130 and 140 in the organic layer depositing apparatus 1 illustrated in FIG. 1. FIG. 5 is a perspective view for describing an arrangement of the first and second pattern sheets 130 and 140 in the organic layer depositing apparatus 1 illustrated in FIG. 4.

Figure 5:
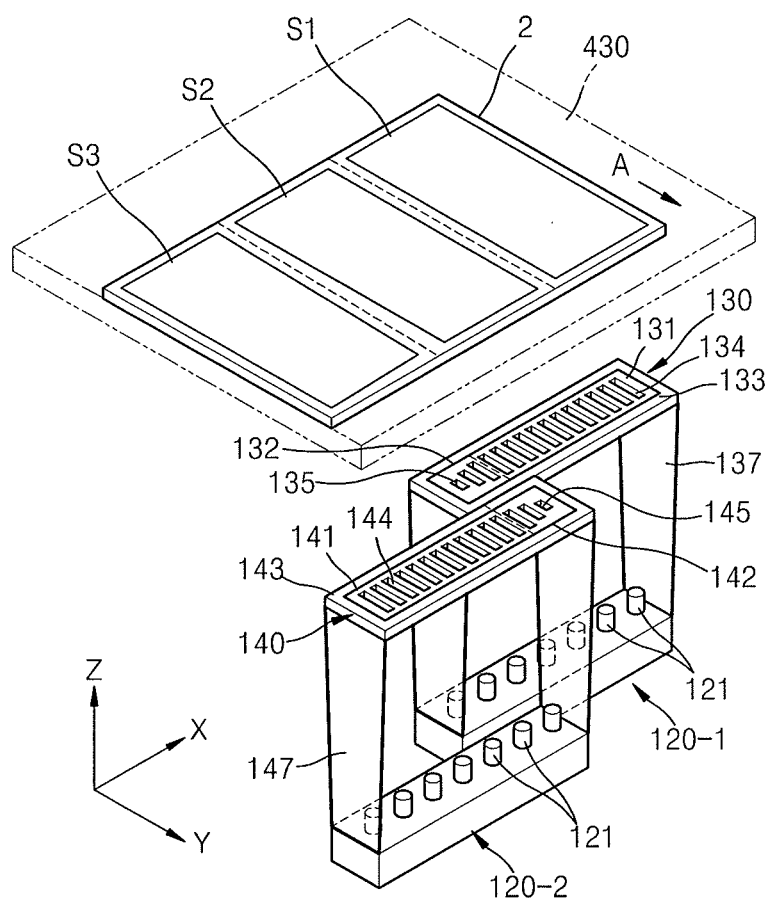
FIG. 5 illustrates a perspective view for describing an arrangement of the first and second pattern sheets in the organic layer depositing apparatus illustrated in FIG. 4.

Referring to FIGS. 4 and 5, the first pattern sheet 130 may be disposed to face the deposition source nozzle unit 120-1. In addition, the first pattern sheet 130 may include a first patterning unit 131 defining a plurality of first patterning slits 134 and a first overlap unit 132 that is connected to the first patterning unit 131 and defines a plurality of first overlap patterning slits 135 through which the deposition material 115 passes. The plurality of first patterning slits 134 being opened such that the deposition material 115 passed therethrough. The first pattern sheet 130 may be, for example, tensile-welded on a first frame 133 that may have a shape of a window frame, for example. The first frame 133 may be disposed on the second stage 170 (see FIG. 3) of the deposition unit 100.

The second pattern sheet 140 may be disposed to face the deposition source nozzle unit 120-2. In addition, the second pattern sheet 140 may include a second patterning unit 141 defining a plurality of second patterning slits 144 and a second overlap unit 142 that is connected to the second patterning unit 141 and defines a plurality of second overlap patterning slits 145 through which the deposition material 115 passes. The plurality of second patterning slits 144 being opened such that the deposition material 115 passed therethrough. The second pattern sheet 140 may be, for example, tensile-welded on a second frame 143 that may have of a window frame, for example. The second frame 143 may be disposed on the second stage 170 (see FIG. 3) of the deposition unit 100.

Referring to FIG. 5, the deposition source 110 as well as the deposition source nozzle units 120 (120-1 and 120-2) coupled to the deposition source 110 may be respectively connected to the first and second pattern sheets 130 and 140 through connection members 147 and 137.

That is, the deposition source 110, the deposition source nozzle units 120 (120-1 and 120-2), and the first and second pattern sheets 130 and 140 may be respectively connected to one another through the connection members 137 and 147 and may be integrally formed to one another. The connection members 137 and 147 may guide the movement path of the deposition material 115 such that the deposition material 115 sprayed through the deposition source nozzles 121 is not dispersed to the outside. In particular, the connection members 137 and 147 may completely close spaces between the deposition source 110, the deposition source nozzle units 120, and the first and second pattern sheets 130 and 140 from the outside.

The connection members 137 and 147 are illustrated in FIG. 5 as being disposed only in left and right directions of the deposition source 110, the deposition source nozzle units 120 (120-1 and 120-2), and the first and second pattern sheets 130 and 140 to guide the deposition material 115 only in the X direction. However, this is illustrated for convenience, and exemplary embodiments are not limited thereto. The connection members 137 and 147 may have a closed shape, for example, a box shape and may guide the deposition material 115 to be moved in the X-axis direction and the Y-axis direction at the same time, for example.

Such a configuration is illustrated in FIGS. 2 and 3, but the connection between the deposition source 110, the deposition source nozzle units 120 (120-1 and 120-2), and the first and second pattern sheets 130 and 140 may only be include in some exemplary embodiments. Therefore, for convenience, the following description will be focused on the organic layer depositing apparatus 1 including the deposition assembly 100-5 that does not include the connection members 137 and 147.

The first and second pattern sheets 130 and 140 may be arranged to be symmetric with each other with respect to a transfer direction (Y-axis direction) of the substrate 2. The first overlap unit 132 of the first pattern sheet 130 and the second overlap unit 142 of the second pattern sheet 140 may be arranged to partially overlap each other with respect to the Y-axis direction. Therefore, at least a portion of the first overlap patterning slits 135 defined in the first overlap unit 132 may overlap at least a portion of the second overlap patterning slits 145 defined in the second overlap unit 142.

Due to the arrangement of the first and second pattern sheets 130 and 140 described above, the deposition material 115 passing through each of the first and second pattern sheets 130 and 140 may be deposited on different regions of the substrate 2, which correspond to reference symbols S1, S2, and S3 of FIG. 4.

Conventional first and second pattern sheets are arranged in a zigzag shape with respect to any straight line that extends in the transfer direction (i.e., Y-axis-direction) of the substrate 2 and passes a center of the substrate 2. That is, unlike exemplary embodiments, the conventional first and second pattern sheets do not include the first and second overlap units 132 and 142, respectively.

In a case of a deposition assembly having a structure in which the conventional first and second pattern sheets do not respectively include the first and second overlap units 132 and 142 and are arranged to cross each other in the Y-axis direction, spots may occur when the deposition is performed on three different regions (i.e., reference symbols S1, S2, and S3) as illustrated in FIG. 4. These spots may not occur when a deposition is performed on two different regions.

The spots of the conventional pattern sheets may indicate a phenomenon in which a thickness of a pattern layer is not uniform. The pattern layer that is being deposited on a central region (reference symbol S2) of the substrate 2 through first and second patterning slits and respectively defined in an end portion of the first pattern sheet adjacent to the second pattern sheet and an end portion of the second pattern sheet adjacent to the first pattern sheet.

In order to prevent the spots from occurring, in exemplary embodiments, a pattern layer may be uniformly deposited on an entire region of the substrate 2 by performing a deposition process in a state in which the first and second pattern sheets 130 and 140 partially overlap each other. That is, the first overlap unit 132 of the first pattern sheet 130 and the second overlap unit 142 of the second pattern sheet 140 may be arranged to overlap each other.

A principle, in which the pattern layer is uniformly deposited on the entire region of the substrate 2 by using the first and second overlap units 132 and 142, will be described in detail below.

A method of depositing an organic layer by using an organic layer depositing apparatus 1 will be described with reference to FIGS. 1 to 5.

After a substrate 2 is fixed to a moving unit 430 in a loading unit 200, the moving unit 430 may be mounted on a first transfer unit 410 through a first inversion chamber 218. The first transfer unit 410 may enter a chamber 101 and may sequentially pass through deposition assemblies 100-1 to 100-11 to form organic layers respectively corresponding to the deposition assemblies 100-1 to 100-11.

The organic layers to be formed may be different from one another, and each of the organic layers may include, for example, an organic emission layer and may include a hole injection layer (HIL), a hole transport layer, an electron transport layer, and an electron injection layer in addition to the organic emission layer. The hole injection layer, the hole transport layer, the electron transport layer, and the electron injection layer may constitute a common layer, for example, and the organic emission layer may constitute a pattern layer, for example. The organic emission layer may be various layers according to colors to be implemented.

As described above, when the deposition of the organic layers is completed, the substrate 2 may be separated from the moving unit 430 in the unloading unit 300 and may be ejected to the outside. After a counter electrode is formed on each of the organic layers, an organic light-emitting display device 10 may be manufactured by sealing the organic layers through a thin film encapsulating layer or an encapsulating substrate.

A method of forming the pattern layer will be described in detail. The substrate 2 may be linearly moved according to a movement of the first transfer unit 410 to enter the deposition assemblies 100-n.

When a deposition material is evaporated or sublimated in a deposition source 110 to be sprayed, the deposition material passing through first and second pattern sheets 130 and 140 may be deposited on the substrate 2. In this case, the deposition material may be deposited on different regions of the substrate 2. In particular, the deposition material passing through the first pattern sheet 130 may be deposited on a portion of each of first and second regions S1 and S2 in the substrate 2. After the deposition material is deposited on the substrate 2 through the first pattern sheet 130, the deposition material passing through the second pattern sheet 140 may be deposited on a third region S3 and a portion of the second region S2 in the substrate 2.

That is, the deposition material may pass through a first patterning unit 131 of the first pattern sheet 130 and a second patterning unit 141 of the second pattern sheet 140 and may be deposited on the first and third regions S1 and S3 of the substrate 2, which are different from each other. The deposition material passing through a first overlap unit 132 of the first pattern sheet 130 and a second overlap unit 142 of the second pattern sheet 140 may be deposited on the same second region S2 of the substrate 2.

Due to connection members 137 and 147 connecting the deposition source 110, and deposition source nozzle units 120 (120-1 and 120-2) coupled to the deposition source 110, and the first and second pattern sheets 130 and 140 to one another, a movement path of the deposition material may be guided such that the deposition material sprayed through deposition source nozzles 121 is not dispersed to the outside.

The connection member 137 is illustrated in FIG. 5 as being disposed only in left and right directions of the deposition source 110, the deposition source nozzle units 120 (120-1 and 120-2), and the first and second pattern sheets 130 and 140 to guide the deposition material only in an X direction. However, this is illustrated for convenience, and exemplary embodiments are not limited thereto. The connection member 137 may have a closed shape, for example, a box shape, and may guide the deposition material to be moved in the X-axis direction and the Y-axis direction at the same time, for example.

As the deposition material sequentially passes through the first and second pattern sheets 130 and 140 according the transfer of the substrate 2, the deposition of the organic layers may be continuously performed.

The substrate 2 may have various sizes. After the deposition of the organic layers is completed, when other layers are formed, a plurality of regions or cells S1, S2, and S3 constituting one organic light-emitting display device 10 may be formed on the substrate 2.

In order to improve productivity, the substrate 2 may be designed such that various types of cells S1, S2, and S3 are formed on one substrate 2. In particular, in order to improve the productivity, it is necessary that the substrate 2 becomes larger, and in order to perform a deposition on the large-sized substrate 2, it is necessary that a conventional pattern sheet is manufactured to be nearly identical to the substrate 2.

However, when the pattern sheet is not provided in plurality, and the pattern sheet is manufactured to correspond to a size of the large-sized substrate 2, the conventional pattern sheet may be deformed or sag due to a load thereof. In this case, since a position of an organic layer deposited through the pattern sheet is inaccurate, a product defect rate may be increased.

However, according to exemplary embodiments, since the first and second pattern sheets 130 and 140 are used, the deformation or the sagging of the first and second pattern sheets 130 and 140 may be minimized. Furthermore, according to exemplary embodiments, although the substrate 2 becomes larger, the deposition may be performed on an entire area of the substrate 2, so that the productivity may be improved, and the deformation or the sagging of the substrate 2 may be minimized, so that an accurate organic layer may be deposited.

Effects, which are acquirable through the aforementioned arrangement of the first and second pattern sheets 130 and 140, will be described in detail with reference to FIGS. 6 to 14.

Figure 6:
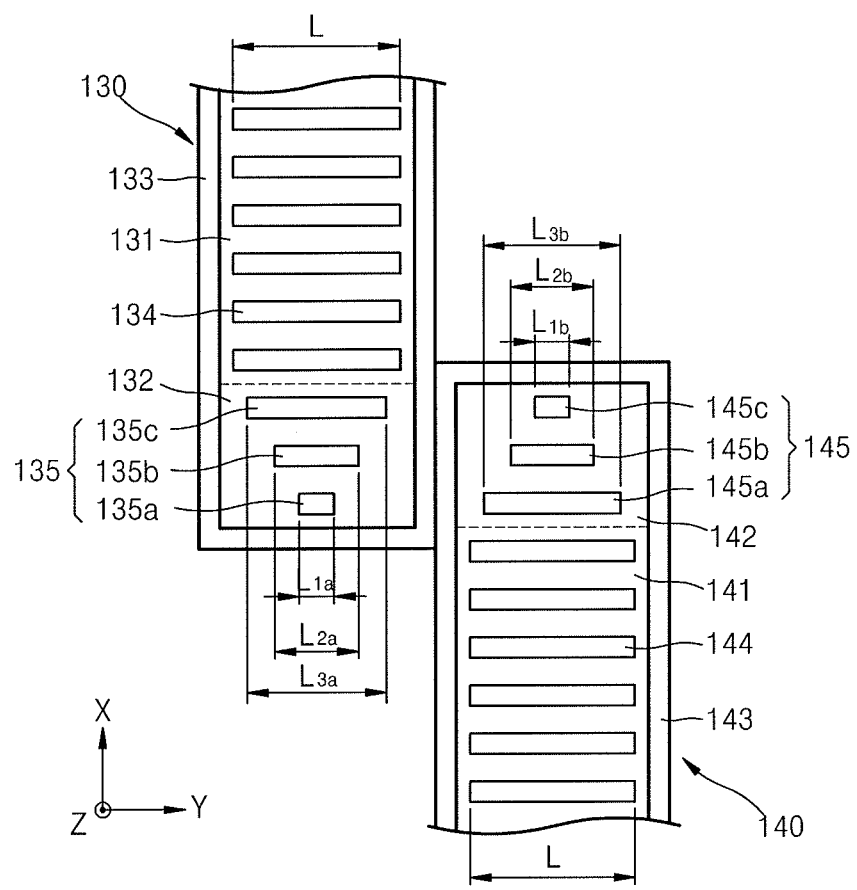
FIG. 6 illustrates a plan view of a portion of the first and second pattern sheets illustrated in FIG. 4.
Figure 7A:
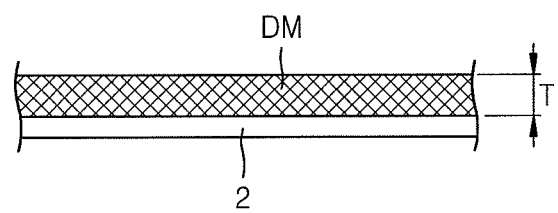
FIG. 7A illustrates a cross-sectional view for describing a state in which a third organic layer is deposited on a substrate through a first or second patterning slit of the organic layer depositing apparatus illustrated in FIG. 4.
Figure 7B:
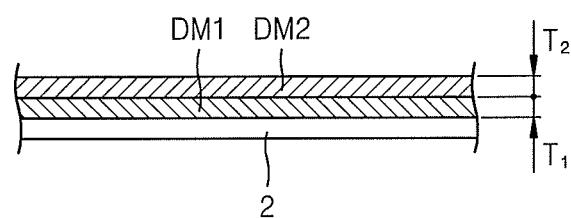
FIG. 7B illustrates a cross-sectional view for describing a state in which first and second organic layers are deposited on a substrate through first and second overlap patterning slits of the organic layer depositing apparatus illustrated in FIG. 4.
Figure 8:
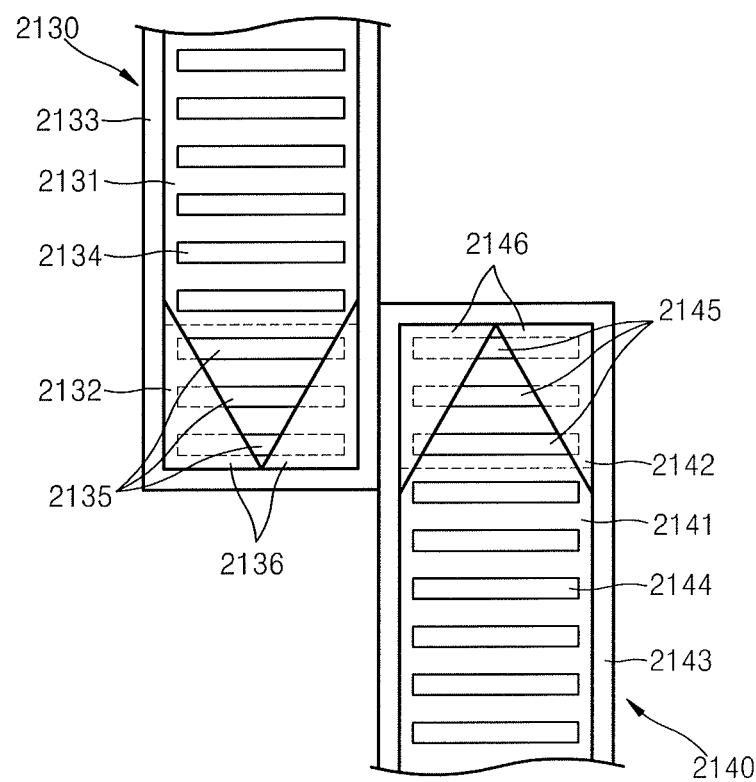
FIG. 8 illustrates a plan view of a modification of FIG. 6.
Figure 9:
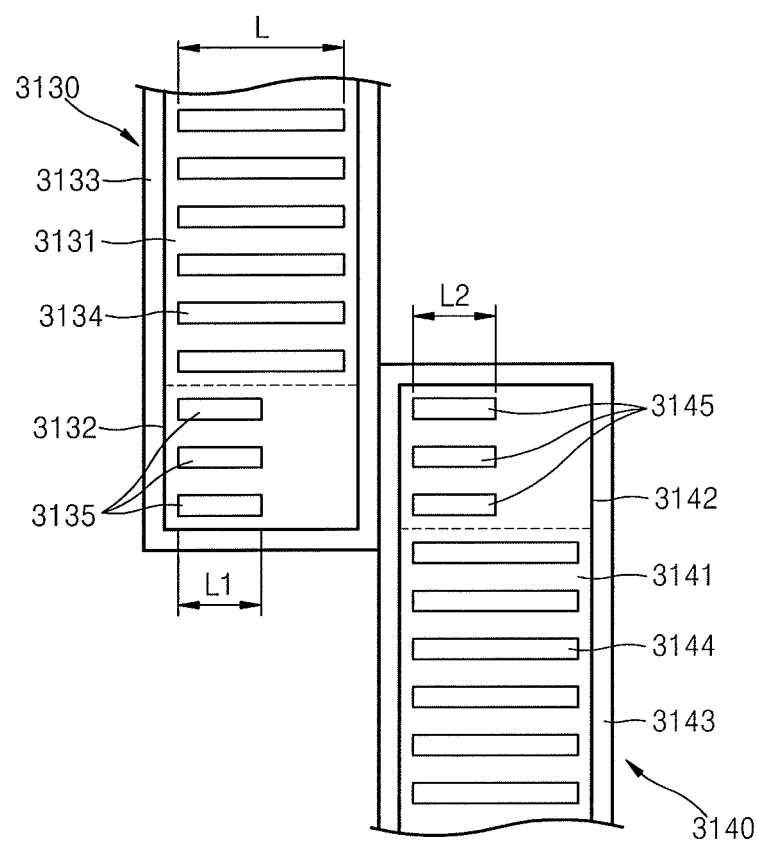
FIG. 9 illustrates a plan view of another modification of FIG. 6.
Figure 10:
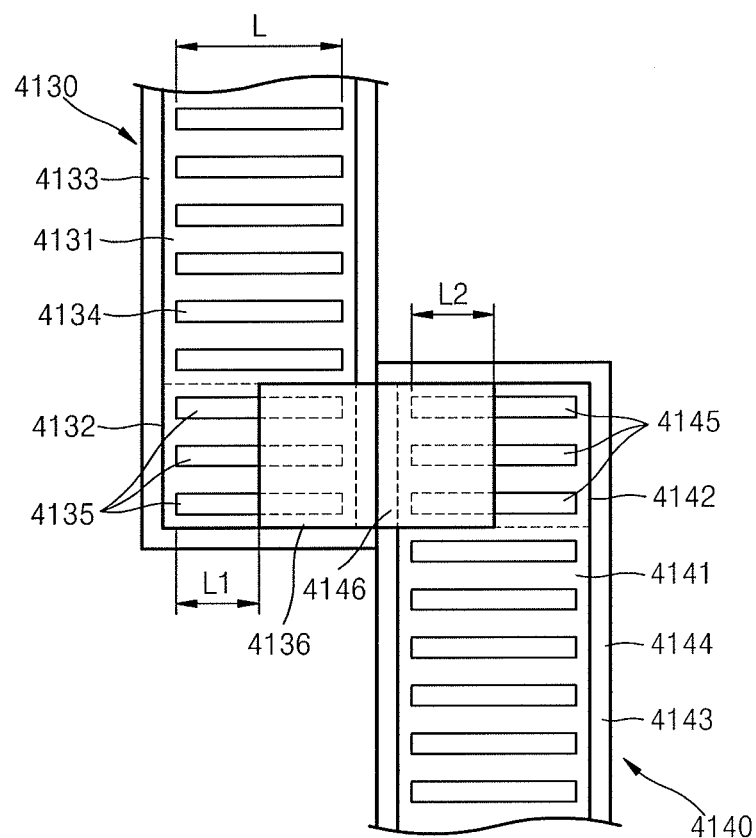
FIG. 10 illustrates a plan view of a modification of FIG. 9.
Figure 11:
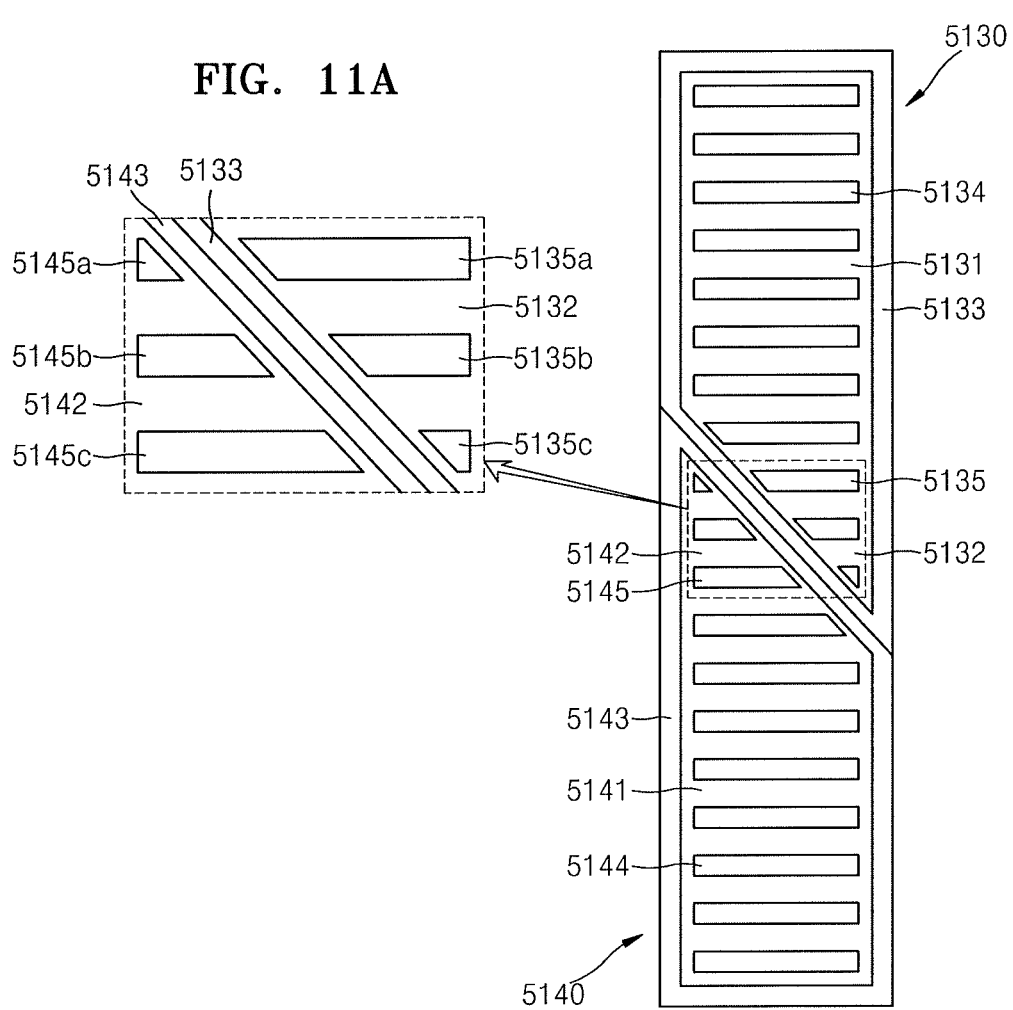
Figure 12:
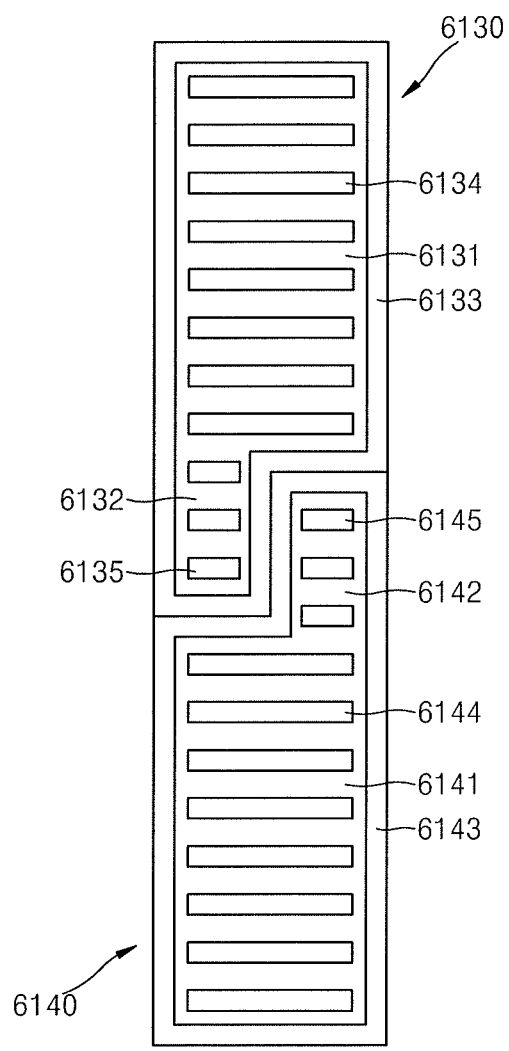
FIG. 12 illustrates a plan view of another modification of FIG. 6.
Figure 13:
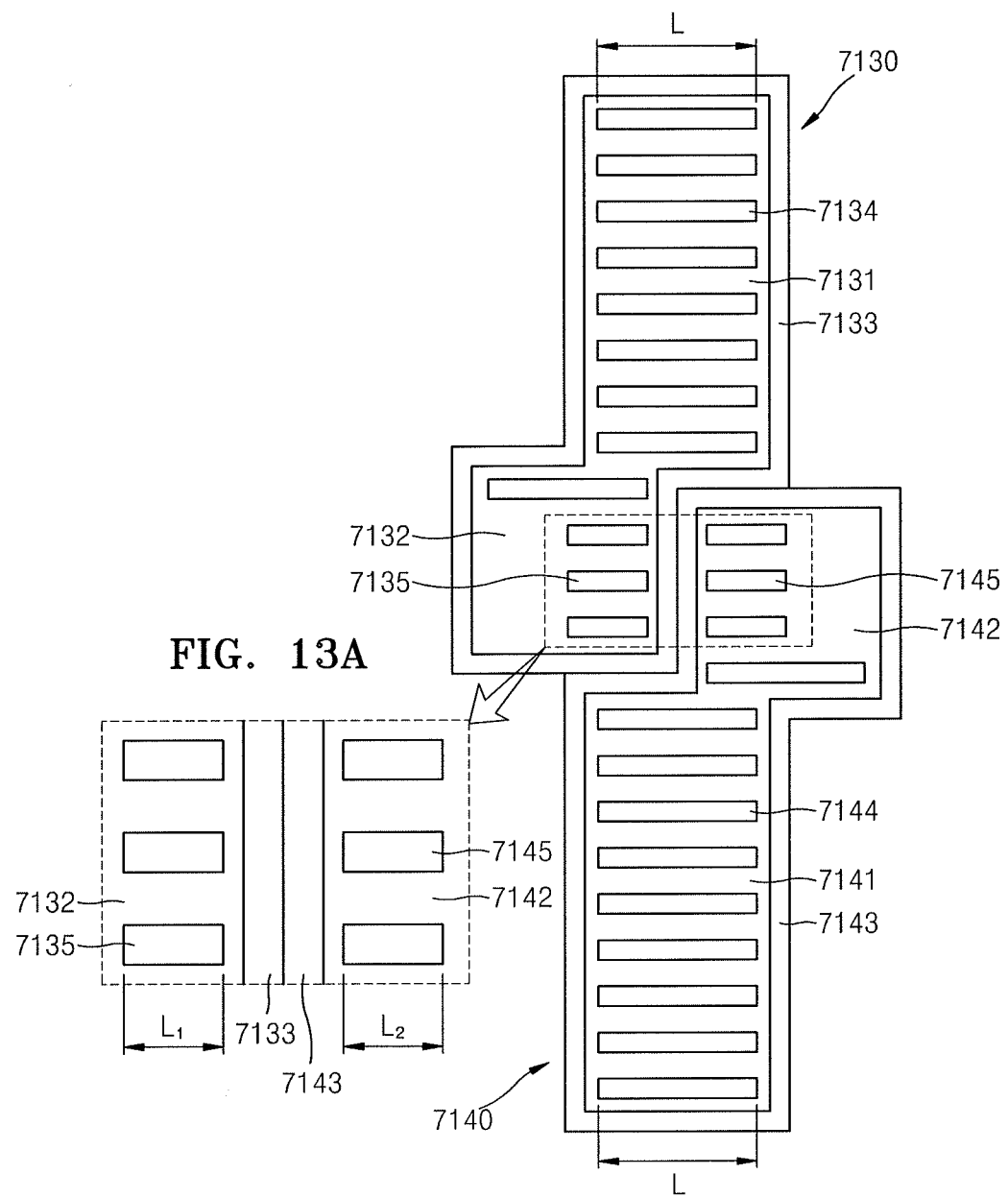
Figure 14:
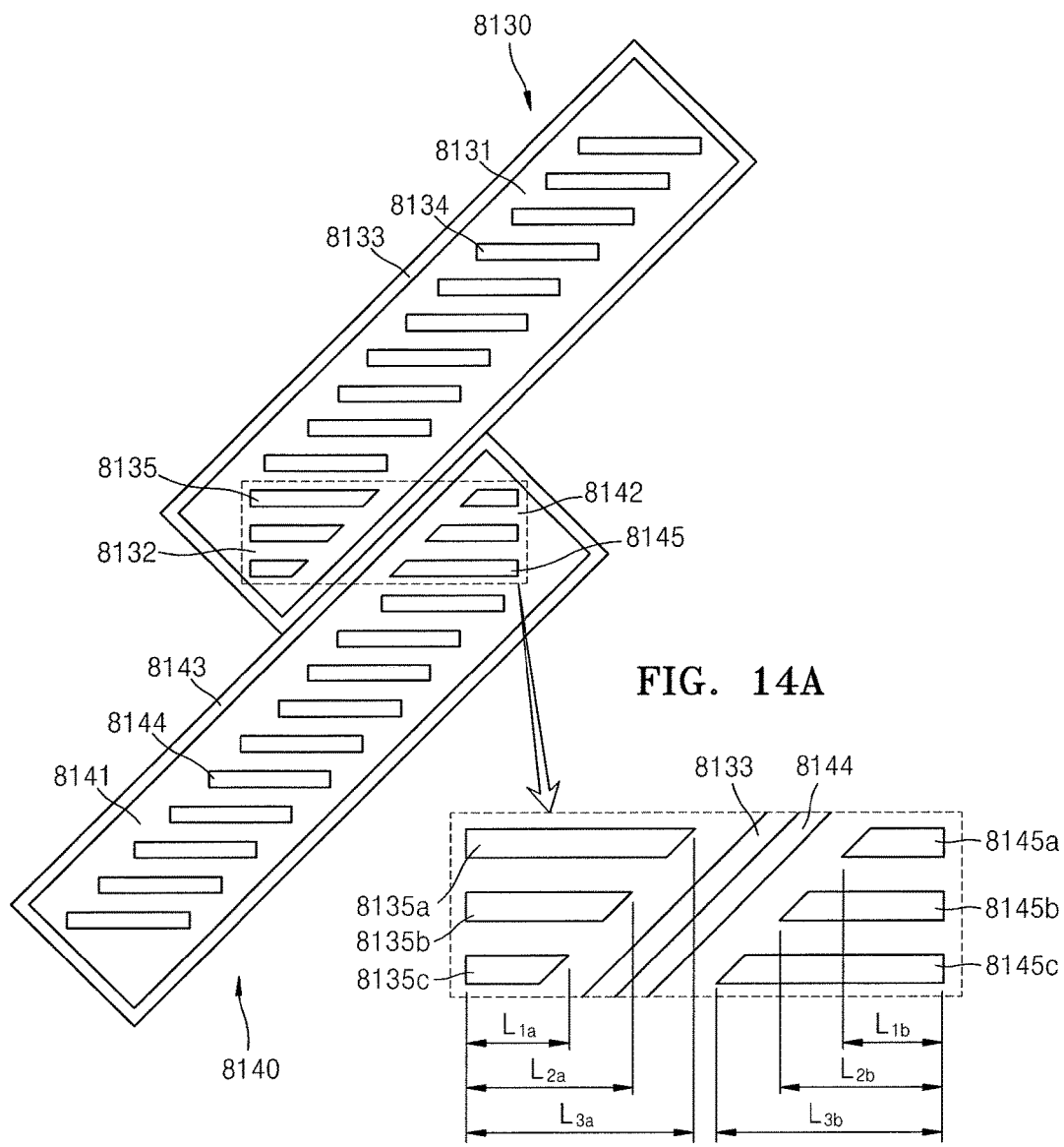

FIG. 6 is a plan view of a portion of the first and second pattern sheets 130 and 140 illustrated in FIG. 4. FIG. 7A is a cross-sectional view for describing a state in which a third organic layer DM is deposited on a substrate 2 through first and second patterning slits 134 and 144 of the organic layer depositing apparatus 1 illustrated in FIG. 4. FIG. 7B is a cross-sectional view for describing a state in which first and second organic layers DM1 and DM2 are sequentially deposited on a substrate through first and second overlap patterning slits 135 and 145 of the organic layer depositing apparatus 1 illustrated in FIG. 4. FIG. 8 is a plan view of a modification of FIG. 6. FIG. 9 is a plan view of another modification of FIG. 6. FIG. 10 is a plan view of a modification of FIG. 9. FIGS. 11 and 11A are plan views of another modification of FIG. 6. FIG. 12 is a plan view of another modification of FIG. 6. FIGS. 13 and 13A are plan views of another modification of FIG. 6. FIGS. 14 and 14A are plan views of another modification of FIG. 6.

Hereinafter, since the overall structures of the first and second pattern sheets 130 and 140 have been described in detail above, more detailed descriptions thereof will be omitted, and first and second overlap units 132 and 142 will be described in detail.

Referring to FIG. 6, as described above, a first overlap patterning slit 135 and a second overlap patterning slit 145 may be defined in the first overlap unit 132 and the second overlap unit 142, respectively. A length of the first overlap patterning slits 135 and a length of the second overlap patterning slits 145 may be different from a length of the first patterning slits 134 defined in a first patterning unit 131 and a length of the second patterning slits 144 defined in a second patterning unit 141, respectively.

Each of the first and second overlap patterning slits 135 and 145 is illustrated in FIG. 6 as having three slits, for example, but exemplary embodiments are not limited thereto. For example, one or more first overlap patterning slits 135 and one or more second overlap patterning slits 145 may be defined. That is, the number of the first and second overlap patterning slits 135 and 145 may not be limited, but the number of the first overlap patterning slits 135 may be substantially the same as the number of the second overlap patterning slits 145.

When the number of the first overlap patterning slits 135 is substantially the same as the number of the second overlap patterning slits 145, the first overlap patterning slits 135 may overlap the second overlap patterning slits 145, respectively. That is, one first overlap patterning slit 135$c$ may overlap one second overlap patterning slit 145$c$, and another first overlap patterning slit 135$b$ may overlap another second overlap patterning slit 145$b$.

The sum of a length L1$a$ of the one first overlap patterning slit 135$a$ and a length L3$b$ of the one second overlap patterning slit 145$a$ may correspond to a length L of each of the first patterning slits 134 or the second patterning slits 144. The sum of a length L2$a$ of the another first overlap patterning slit 135$b$ and a length L2$b$ of the another second overlap patterning slit 145$b$ may correspond to the length L of the each of the first patterning slits 134 or the second patterning slits 144. In addition, the sum of a length L3$a$ of the other first overlap patterning slit 135$c$ and a length L1$b$ of the other second overlap patterning slit 145$c$ may correspond to the length L of each of the first patterning slits 134 or the second patterning slits 144.

FIG. 6 illustrates an exemplary embodiment of the first and second overlap patterning slits 135 and 145. As illustrated in FIG. 6, the first and second overlap patterning slits 135 and 145 may be gradually linearly shortened toward end portions of the first and second pattern sheets 130 and 140, respectively, but exemplary embodiments are not limited thereto. Another exemplary embodiment of the first and second overlap patterning slits 135 and 145 will be described in detail with reference to FIGS. 8 to 14.

Specifically, assuming that each of the first patterning slits 134, each of the second patterning slits 144, each of the first overlap patterning slits 135, and each of the second overlap patterning slits 145 have substantially the same width, when the sum of a length of each of the first overlap patterning slits 135 and a length of each of the second overlap patterning slits 145 corresponds to a length of each of the first patterning slits 134 or the second patterning slits 144, a thickness of a deposition material, which is deposited on a substrate 2 through the first and second overlap units 132 and 142 which overlap each other, may be substantially the same as a thickness of a deposition material deposited on the substrate 2 through the first and second patterning units 131 and 141. That is, a thickness of each of pattern layers respectively deposited on the substrate 2 through the first and second patterning units 131 and 141 and the first and second overlap units 132 and 142 may be uniform as a whole.

Specifically, referring to FIGS. 7A and 7B with respect to the thickness of each of the pattern layers, the third organic layer DM, which is deposited on the substrate 2 through the first patterning slits 134 or the second patterning slits 144 illustrated in FIG. 6, may have a thickness T. A first organic layer DM1 and a second organic layer DM2, which are respectively deposited on the substrate 2 through the first and second overlap patterning slits 135 and 145 illustrated in FIG. 6, may have a thickness T1 and a thickness T2, respectively.

The sum of the thicknesses T1 and T2 of the first and second organic layers DM1 and DM2 may correspond to the thickness T of the third organic layer DM deposited through the first patterning slits 134 or the second patterning slits 144. The first organic layer DM1 may be deposited through the first overlap patterning slits 135 and the second organic layer DM2 may be deposited on the first organic layer DM1 through the second overlap patterning slits 145.

That is, when a deposition process is performed by arranging the first and second overlap units 132 and 142 to overlap each other in a deposition assembly 100-5, a spot phenomenon may be prevented, so that an organic layer having a uniform thickness may be deposited on the substrate 2. The spot phenomenon occurring due to an ununiform deposition on a region in which conventional first and second pattern sheets are adjacent.

Referring to FIG. 8, all of first patterning slits 2134, second patterning slits 2144, first overlap patterning slits 2135, and second overlap patterning slits 2145 are illustrated as being defined to have substantially the same length.

First and second pattern sheets 2130 and 2140 having first and second patterning units 2131 and 2141 and first and second frames 2133 and 2143 illustrated in FIG. 8 may respectively further include overlap correcting plates 2136 and 2146 that are respectively disposed on first and second overlap units 2132 and 2142 to adjust lengths of the first and second overlap patterning slits 2135 and 2145, which are opened. The total area of the overlap correcting plates 2136 and 2146 may correspond to an area of the first overlap unit 2132 or the second overlap unit 2142.

Alternatively, the total area of the overlap correcting plates 2136 and 2146 may not correspond to the area of the first overlap unit 2132 or the second overlap unit 2142. However, even in this case, when the total area of the first and second overlap patterning slits 2135 and 2145 covered with the overlap correcting plates 2136 and 2146 corresponds to the total area of three first overlap patterning slits 2135 or three second overlap patterning slits 2145, for example, a deposition process may be performed such that a thickness of a pattern layer deposited on a substrate 2 through the first and second overlap patterning slits 2135 and 2145 corresponds to a thickness of a pattern layer deposited on the substrate 2 through the first and second patterning slits 2134 and 2144.

Therefore, an opening ratio of the combination of the first and second overlap patterning slits 2135 and 2145, the area covered with the overlap correcting plates 2136 and 2146 and the area opened, may substantially correspond to an opening ratio of the first and second overlap patterning slits 135 and 145 illustrated in FIG. 6.

Referring to FIG. 9, three first overlap patterning slits 3135 and three second overlap patterning slits 3145 may be defined in a first overlap unit 3132 and a second overlap unit 3142, respectively. Lengths of the three first overlap patterning slits 3135 may correspond to lengths of the three second overlap patterning slits 3145, respectively. As described above, the sum of a length L1 of each of the first overlap patterning slits 3135 and a length L2 of each of the second overlap patterning slits 3145 may correspond to a length L of each of first patterning slits 3134 or second patterning slits 3144. Effects acquirable through the arrangement of first and second pattern sheets 3130 and 3140 having first and second patterning units 3131 and 3141 and first and second frames 3133 and 3143 and the described structure may be substantially the same as effects acquirable through the arrangement of the first pattern sheets 130 and 2130 and the second pattern sheets 140 and 2140 illustrated in FIGS. 6 and 8.

Referring to FIG. 10, all of first patterning slits 4134, second patterning slits 4144, first overlap patterning slits 4135, and second overlap patterning slits 4145 are illustrated as being defined to have substantially the same length.

The first and second pattern sheets 4130 and 4140 having first and second patterning units 4131 and 4141 and first and second frames 4133 and 4143 illustrated in FIG. 10 may respectively further include overlap correcting plates 4136 and 4146 that are respectively disposed on first and second overlap units 4132 and 4142 to adjust lengths of the first and second overlap patterning slits 4135 and 4145, which are opened.

The overlap correcting plates 4136 and 4146 may be respectively disposed on the first and second overlap units 4132 and 4142 and may also be integrally formed. In either case, the total area of the overlap correcting plates 4136 and 4146 may correspond to an area of the first overlap unit 4132 or the second overlap unit 4142.

Alternatively, the total area of the overlap correcting plates 4136 and 4146 may not correspond to the area of the first overlap unit 4132 or the second overlap unit 4142. However, even in this case, when the total area of the first and second overlap patterning slits 4135 and 4145 covered with the overlap correcting plates 4136 and 4146 corresponds to the total area of three first overlap patterning slits 4135 or three second overlap patterning slits 4145, for example, a deposition process may be performed such that a thickness of a pattern layer deposited on a substrate 2 through the first and second overlap patterning slits 4135 and 4145 corresponds to a thickness of a pattern layer deposited on the substrate 2 through the first and second patterning slits 4134 and 4144.

Referring to FIGS. 11 and 11A, first and second overlap units 5132 and 5142 may gradually become narrower toward end portions of first and second pattern sheets 5130 and 5140, respectively, which have first and second patterning units 5131 and 5141.

Due to such a structure, lengths of first overlap patterning slits 5135 and lengths of second overlap patterning slits 5145 may also be gradually shortened toward the end portions of the first and second pattern sheets 5130 and 5140, respectively, the first overlap patterning slits 5135 and the second overlap patterning slits 5145 being respectively defined in the first overlap unit 5132 and the second overlap unit 5142.

Even in this case, the sum of an area of one first overlap patterning slit 5135a, 5135b, or 5135c and an area of one second overlap patterning slit 5145a, 5145b, or 5145c, which overlap each other, may substantially correspond to an area of one first patterning slit 5134 or one second patterning slit 5144.

The term "substantially" may mean that the sum of the area of each of the first overlap patterning slits 5135 and the area of each of the second overlap patterning slits 5145 does not accurately correspond to the area of each of the first patterning slits 5134 or the second patterning slits 5144 due to first and second frames 5133 and 5143 disposed between the first overlap unit 5132 and the second overlap unit 5142. However, even in this case, a thickness of a deposition material deposited on a substrate 2 may not be substantially changed.

Referring to FIG. 12, a width of each of first and second patterning units 6131 and 6141 may be greater than a width of each of first and second overlap units 6132 and 6142. The term "width" may mean a length of the smallest side of each of the first and second pattern sheets 6130 and 6140.

Due to such a structure, a length of each of first and second overlap patterning slits 6135 and 6145 respectively defined in the first and second overlap units 6132 and 6142 may be less than a length of each of first and second patterning slits 6134 and 6144 respectively defined in the first and second patterning units 6131 and 6141.

Even in this case, the sum of an area of one first overlap patterning slit 6135 and an area of one second overlap patterning slit 6145, which overlap each other in a transfer direction (of arrow A in FIGS. 4 and 5) of a substrate 2, may substantially correspond to an area of one first patterning slit 6134 or one second patterning slit 6144.

The term "substantially" may mean that the sum of the area of each of the first overlap patterning slits 6135 and the area of each of the second overlap patterning slits 6145 does not accurately correspond to the area of each of the first patterning slits 6134 or the second patterning slits 6144 due to first and second frames 6133 and 6143 disposed between the first overlap unit 6132 and the second overlap unit 6142. However, even in this case, a thickness of a deposition material deposited on a substrate 2 may not be substantially changed.

Referring to FIGS. 13 and 13A, first and second overlap units 7132 and 7142 may protrude in width directions of first and second patterning units 7131 and 7141, respectively. The term "width" may mean a length of the smallest side in each of first and second pattern sheets 7130 and 7140.

Due to such a structure, each of lengths L1 and L2 of first and second overlap patterning slits 7135 and 7145 respectively defined in the first and second overlap units 7132 and 7142 may be less than a length L of each of first and second patterning slits 7134 and 7144 respectively defined in the first and second patterning units 7131 and 7141.

Even in this case, the sum of an area of one first overlap patterning slit 7135 and an area of one second overlap patterning slit 7145, which overlap each other in a transfer direction (of arrow A) of a substrate 2, may substantially correspond to an area of one first patterning slit 7134 or one second patterning slit 7144.

The term "substantially" may mean that the sum of the area of each of the first overlap patterning slits 7135 and the area of each of the second overlap patterning slits 7145 does not accurately correspond to the area of each of the first patterning slits 7134 or the second patterning slits 7144 due to first and second frames 7133 and 7143 disposed between the first overlap unit 7132 and the second overlap unit 7142. However, even in this case, a thickness of a deposition material deposited on the substrate 2 may not be substantially changed.

Referring to FIGS. 14 and 14A, each of first and second pattern sheets 8130 and 8140 having first and second patterning units 8131 and 8141 may be disposed to be tilted in a direction crossing a transfer direction (of arrow A) of a substrate 2.

Due to such a structure, lengths of first overlap patterning slits 8135 and second overlap patterning slits 8145, which are respectively defined in a first overlap unit 8132 and a second overlap unit 8142, may be gradually shortened toward end portions of the first and second pattern sheets 8130 and 8140.

Even in this case, the sum of an area of one first overlap patterning slit 8135a, 8135b, or 8135c and an area of one second overlap patterning slit 8145a, 8145b, or 8145c, which overlap each other in a transfer direction (of arrow A) of a substrate 2, may substantially correspond to an area of one first patterning slit 8134 or one second patterning slit 8144.

The term "substantially" may mean that the sum of the area of each of the first overlap patterning slits 8135 and the area of each of the second overlap patterning slits 8145 does not accurately correspond to the area of each of the first patterning slits 8134 or the second patterning slits 8144 due to first and second frames 8133 and 8143 disposed between the first overlap unit 8132 and the second overlap unit 8142. However, even in this case, a thickness of a deposition material deposited on the substrate 2 may not be substantially changed.

Figure 15:
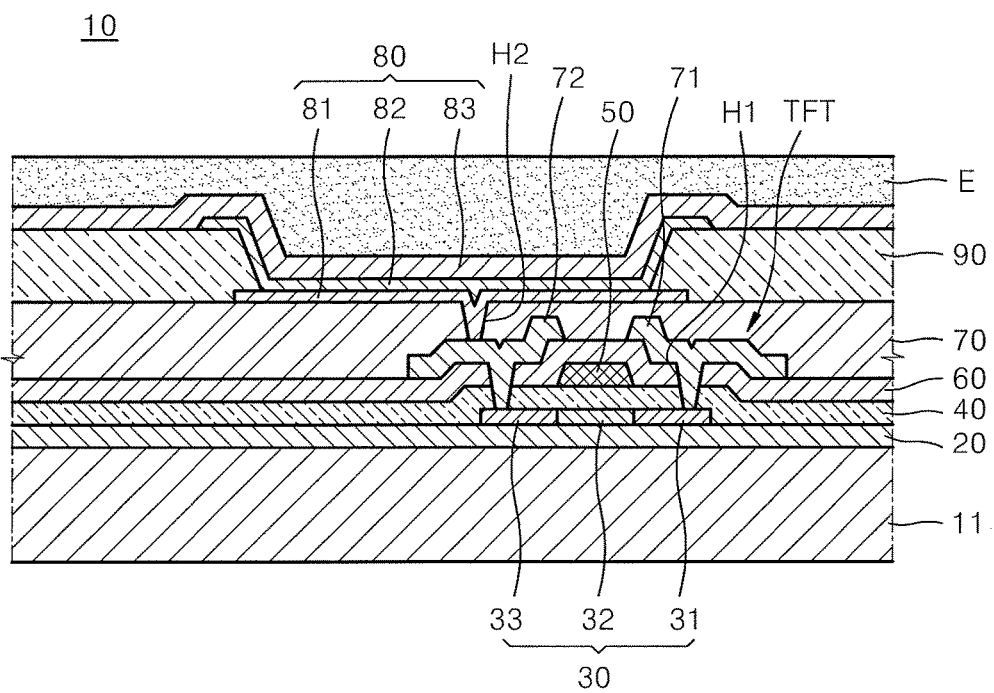
FIG. 15 illustrates a cross-sectional view of a portion of an organic light-emitting display device manufactured by using the organic layer depositing apparatus illustrated in FIG. 1.

FIG. 15 is a cross-sectional view of a portion of an organic light-emitting display device 10 manufactured by using the organic layer depositing apparatus 1 illustrated in FIG. 1.

Referring to FIG. 15, the organic light-emitting display device 10 may include a first substrate 11 and a light emission unit. In addition, the organic light-emitting display device 10 may include a thin film encapsulating layer E or a second substrate, which is disposed on the light emission unit. A material of the first substrate 11 may be, for example, substantially the same as a material of a substrate 2. After the organic light-emitting display device 10 is manufactured, the first substrate 11 may be formed by cutting the substrate in plurality. In addition, since the second substrate is substantially equal or similar to a substrate used in a general organic light-emitting display device, detailed descriptions thereof will be omitted. Hereinafter, for convenience, the following description will be focused on a case where the organic light-emitting display device 10 includes the thin film encapsulating layer E.

The light emission unit may be disposed on the first substrate 11. The light emission unit may include a thin film transistor (TFT). A passivation film 70 may be disposed to cover the light emission unit and the TFT. An organic light-emitting diode (OLED, 80) may be disposed on the passivation film 70.

The first substrate 11 may include a glass material, for example. However, the first substrate 11 is not necessarily limited thereto and may include, for example, at least one material selected from a plastic material and a metal material such as SUS or Ti. In addition, the first substrate 11 may include polyimide (PI), for example. Hereinafter, for convenience, the following description will be focused on a case where the first substrate 11 includes a glass material.

A buffer layer 20 may be further disposed on the first substrate 11. The buffer layer 20 may include, for example, an organic compound and/or an inorganic compound and may include at least one selected from $SiO_x$ ($x \geq 1$) and $SiN_x$ ($x \geq 1$), for example.

After an active layer 30 having predetermined patterns is disposed on the buffer layer 20, and the active layer 30 may be buried by a gate insulating layer 40. The active layer 30 may include a source region 31 and a drain region 33 and may further include a channel region 32 between the source region 31 and the drain region 33.

The active layer 30 may include various materials. For example, the active layer 30 may include an inorganic semiconductor material such as amorphous silicon or crystalline silicon. In another example, the active layer 30 may include an oxide semiconductor material. In another example, the active layer 30 may include an organic semiconductor material. Hereinafter, for convenience, the following description will be focused on a case where the active layer 30 includes amorphous silicon.

The active layer 30 may be formed by forming an amorphous silicon film on the buffer layer 20, crystallizing the amorphous silicon film to form a poly-crystalline silicon film, and patterning the poly-crystalline silicon film. The source region 31 and the drain region 33 of the active layer 30 may be doped with impurities according to a type of TFT such as a driving TFT or a switching TFT.

A gate electrode 50 and an interlayer insulating layer 60 may be formed on the gate insulating layer 40. The gate electrode 50 may correspond to the active layer 30 and the interlayer insulating layer 60 may bury the gate electrode 50.

After a contact hole H1 is formed in the interlayer insulating layer 60 and the gate insulating layer 40, a source electrode 71 and a drain electrode 72 may be formed on the interlayer insulating layer 60 to respectively come into contact with the source region 31 and the drain region 33.

The passivation film 70 may be formed on the TFT and a pixel electrode 81 of the OLED 80 may be formed on the passivation film 70. The pixel electrode 81 may come into contact with the drain electrode 72 of the TFT through a hole H2 formed in the passivation film 70.

The passivation film 70 may include, for example, an inorganic material and/or an organic material and may be formed in a single layer or two layers or more. The passivation film 70 may be, for example, formed as a flattening film such that an upper surface thereof is flattened regardless of an unevenness of a lower film or may be formed to be uneven according to the unevenness of the lower film. The passivation film 70 may include a transparent insulator, for example, to achieve a resonance effect.

After the pixel electrode 81 is formed on the passivation film 70, a pixel defining film 90 may be formed of, for example, an organic material and/or an inorganic material to cover the pixel electrode 81 and the passivation film 70, and may be opened to expose the pixel electrode 81.

An intermediate layer 82 and a counter electrode 83 may be formed at least on the pixel electrode 81.

The pixel electrode 81 may function as an anode, for example, and the counter electrode 83 may function as a cathode, for example. Of course, a polarity between the pixel electrode 81 and the counter electrode 83 may be inverted.

The pixel electrode 81 and the counter electrode 83 may be insulated from each other by the intermediate layer 82, and an organic emission layer may emit light by applying voltages having different polarities to the intermediate layer 82.

The intermediate layer 82 may include an organic emission layer, for example. In an alternative example, the intermediate layer 82 may include an organic emission layer and may further include at least one of a hole injection layer (HIL), a hole transport layer, an electron transport layer, and an electron injection layer in addition to the organic emission layer. The exemplary embodiment is not limited thereto, and the intermediate layer 82 may include the organic emission layer and may further include various functional layers.

One unit pixel may include a plurality of sub-pixels, the plurality of sub-pixels may emit various color light beams. For example, each of the plurality of sub-pixels may include a sub-pixel emitting a red color, green color, or blue color light beam and may include a sub-pixel emitting a red color, green color, or blue color light beam.

The thin film encapsulating layer E may include, for example, a plurality of inorganic layers or may include an inorganic layer and an organic layer.

The organic layer of the thin film encapsulating layer E may include, for example, a polymer and may be a single layer or a laminated film that includes at least one selected from polyethylene terephthalate, polyimide, epoxy, polyethylene, and polyacrylate. The organic layer may include, for example, polyacrylate, specifically, a material obtained by polymerizing a monomer composite including a diacrylate-based monomer and a triacrylate monomer. A monoacrylate-based monomer may be further included in the monomer composite. In addition, a well known photoinitiatior such as TPO, for example, may be included in the monomer composite, but exemplary embodiments are not limited thereto.

The inorganic layer of the thin film encapsulating layer E may be a single layer or a laminated film that includes, for example, at least one material selected from metal oxide or metal nitride. Specifically, the inorganic layer may include at least one selected from $SiN_x$, $Al_2O_3$, $SiO_2$, and $TiO_2$, for example.

A top layer of the thin film encapsulating layer E, which is exposed to the outside, may be formed, for example, as an inorganic layer to prevent moisture from permeating into the OLED 80.

The thin film encapsulating layer E may include, for example, at least one sandwich structure in which at least one organic layer is disposed between at least two inorganic layers. In another example, the thin film encapsulating layer E may include at least one sandwich structure in which at least one inorganic layer is disposed between at least two organic layers. In another example, the thin film encapsulating layer E may include a sandwich structure in which at least one organic layer is disposed between at least two inorganic layers and a sandwich structure in which at least one inorganic layer is disposed between at least two organic layers.

The thin film encapsulating layer E may include, for example, a first inorganic layer, a first organic layer, and a second inorganic layer in order from an upper portion of the OLED 80.

In another example, the thin film encapsulating layer E may include a first inorganic layer, a first organic layer, a second inorganic layer, a second organic layer, and a third inorganic layer in order from the upper portion of the OLED 80.

In another example, the thin film encapsulating layer E may include a first inorganic layer, a first organic layer, a second inorganic layer, a second organic layer, a third inorganic layer, a third organic layer, and a fourth inorganic layer in order from the upper portion of the OLED 80.

A metal halide layer including LIF may be further disposed between the OLED 80 and the first inorganic layer. The metal halide layer may prevent the damage of the OLED 80 when the first inorganic layer is formed through sputtering.

In an example, an area of the first organic layer may be less than an area of the second inorganic layer, and an area of the second organic layer may also less than an area of the third inorganic layer.

In the organic light-emitting display device 10, the intermediate layer 82, that is, an organic layer, may be formed by using the organic layer depositing apparatus 1 described with reference to FIGS. 1 to 5.

Therefore, the organic light-emitting display device 10 may include the intermediate layer 82 having precise patterns. In addition, the organic light-emitting display device 10 may have excellent emission performance and may minimize defective pixels.

By way of summation and review, one of the various methods of forming an organic light-emitting device is an independent deposition method. In order to manufacture the organic light-emitting display device by using a deposition method, the intermediate layer, or the like, having predetermined patterns is formed by bringing a fine metal mask (FMM) into close contact with a substrate, on which the intermediate layer is to be formed, and depositing a material of the intermediate layer. The FMM having openings that have patterns equal or similar to patterns of the intermediate layer or the like.

However, the use of the FMM may be unsuitable for manufacturing a large-sized organic light-emitting display device by using a large-sized mother glass because the use of a large-sized mask may cause a warpage phenomenon due to a self weight thereof and patterns may be distorted by the warpage phenomenon. This is a departure from the typical fine pitch in patterns of organic light-emitting devices.

Furthermore, after the FMM is aligned with the substrate and brought into close contact with the substrate and a deposition is performed, a substantial amount of time is taken to re-separate the FMM from the substrate. Accordingly, it may take considerable time to manufacture the organic light-emitting display device and production efficiency may be low.

An organic light-emitting display device according to exemplary embodiments may implement a high definition image quality. An organic layer depositing apparatus and a method of manufacturing an organic light-emitting display device using the organic layer depositing apparatus according to exemplary embodiments may uniformly deposit an organic layer on a display panel.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic layer depositing apparatus comprising a deposition unit including one or more deposition assemblies spaced a predetermined distance apart from a substrate to deposit a deposition material on the substrate,
   wherein the one or more deposition assemblies comprise:
   a deposition source that sprays the deposition material;
   a deposition source nozzle unit on the deposition source and in which deposition source nozzles are disposed;
   a first pattern sheet disposed to face the deposition source nozzle unit and including a first patterning unit and a first overlap unit, the first patterning unit defining a first patterning slit through which the deposition material passes, and the first overlap unit being connected to the first patterning unit and defining a first overlap patterning slit through which the deposition material passes; and
   a second pattern sheet disposed to face the deposition source nozzle unit and including a second patterning unit and a second overlap unit, the second patterning unit defining a second patterning slit through which the deposition material passes, and the second overlap unit being connected to the second patterning unit and defining a second overlap patterning slit through which the deposition material passes, and
   wherein the first and second pattern sheets are arranged such that the first and second overlap units overlap each other, and the first and second patterning units do not overlap each other, and wherein:
   the first patterning unit and the first overlap unit are on a first frame, and
   the second patterning unit and the second overlap unit are on a second frame adjacent to the first frame.

2. The organic layer depositing apparatus as claimed in claim 1, wherein the first and second patterning units are spaced apart from each other such that the deposition material passes through the first and second patterning units and is respectively deposited on different regions of the substrate.

3. The organic layer depositing apparatus as claimed in claim 1, wherein the deposition material passing through the first and second overlap units is deposited on a same region of the substrate.

4. The organic layer depositing apparatus as claimed in claim 1, wherein at least a portion of the first overlap patterning slit overlaps at least a portion of the second overlap patterning slit.

5. The organic layer depositing apparatus as claimed in claim 4, wherein a sum of areas in the overlapping portions of the first and second overlap patterning slits corresponds to an area of the first patterning slit or the second patterning slit.

6. The organic layer depositing apparatus as claimed in claim 1, wherein an area of the first patterning slit is greater than an area of the first overlap patterning slit.

7. The organic layer depositing apparatus as claimed in claim 1, wherein an area of the second patterning slit is greater than an area of the second overlap patterning slit.

8. The organic layer depositing apparatus as claimed in claim 1, wherein the first or second overlap patterning slit is a plurality of overlap patterning slits, and lengths of the plurality of the first overlap patterning slits or the plurality of the second overlap patterning slits are gradually linearly shortened toward an end portion of the first pattern sheet or the second pattern sheet, respectively.

9. The organic layer depositing apparatus as claimed in claim 1, wherein the first and second overlap units gradually become narrower toward end portions of the first and second pattern sheets, respectively.

10. The organic layer depositing apparatus as claimed in claim 1, wherein widths of the first and second patterning units are greater than widths of the first and second overlap units, respectively.

11. The organic layer depositing apparatus as claimed in claim 1, wherein the first and second overlap units protrude in width directions of the first and second patterning units, respectively.

12. The organic layer depositing apparatus as claimed in claim 1, further comprising an overlap correcting plate disposed on at least one of the first and second pattern sheets to adjust a length of each of the first and second overlap patterning slits, wherein the first and second overlap patterning slits are opened.

13. The organic layer depositing apparatus as claimed in claim 12, wherein an entire area of the overlap correcting plate corresponds to an area of the first overlap unit or the second overlap unit.

14. The organic layer depositing apparatus as claimed in claim 1, further comprising a transfer unit including:
   a first transfer unit that transfers a moving unit in a first direction in which the deposition material is deposited, the substrate being detachably fixed to the moving unit; and
   a second transfer unit that transfers the moving unit when the substrate has been separated therefrom in a second direction opposite to the first direction,
   the transfer unit allowing the moving unit to be cyclically transferred by the first and second transfer units.

15. An organic light-emitting device comprising:
   a substrate;
   at least one thin film transistor on the substrate including a semiconductor active layer, a gate electrode insulated from the semiconductor active layer, and source and drain electrodes, each of the source and drain electrodes coming into contact with the semiconductor active layer;
   a plurality of pixel electrodes on the thin film transistor;
   a plurality of organic layers on the plurality of pixel electrodes; and
   a plurality of counter electrodes on the plurality of organic layers,
   wherein at least one of the plurality of organic layers on the substrate is formed using the organic layer depositing apparatus of as claimed in claim 1.

16. A method of manufacturing an organic light-emitting display device by using an organic layer depositing device configured to deposit an organic layer on a substrate, the method comprising:
   fixing the substrate to a moving unit in a loading unit;
   transferring the moving unit to which the substrate is fixed to a chamber by using a first transfer unit disposed to penetrate through the chamber;
   forming an organic layer by depositing a deposition material on different regions of the substrate, the deposition material being sprayed from a deposition source nozzle unit of a deposition assembly while the substrate is relatively moved with respect to the deposition assembly, the substrate and the deposition assembly being disposed in the chamber and spaced apart from each other, the substrate passing through first and second pattern sheets, and the first and second pattern sheets being spaced apart from each other;
   separating the substrate from the moving unit in an unloading unit when the depositing is completed; and
   transferring the moving unit from which the substrate is separated to the loading unit by using a second transfer unit disposed to penetrate through the chamber,
   wherein the first pattern sheet is disposed to face the deposition source nozzle unit and includes a first patterning unit and a first overlap unit, the first patterning unit defining a first patterning slit through which the deposition material passes, and the first overlap unit being connected to the first patterning unit and defining a first overlap patterning slit through which the deposition material passes;
   the second pattern sheet is disposed to face the deposition source nozzle unit and includes a second patterning unit and a second overlap unit, the second patterning unit defining a second patterning slit through which the deposition material passes, and the second overlap unit being connected to the second patterning unit and defining a second overlap patterning slit through which the deposition material passes; and
   the first and second pattern sheets are arranged such that the first and second overlap units overlap each other, and the first and second patterning units do not overlap each other, and wherein:
   the first patterning unit and the first overlap unit are on a first frame, and
   the second patterning unit and the second overlap unit are on a second frame adjacent to the first frame.

17. The method as claimed in claim 16, wherein the first and second patterning units are spaced apart from each other such that the deposition material passes through the first and second patterning units and is respectively deposited on different regions of the substrate.

18. The method as claimed in claim 16, wherein a first organic layer is deposited on the substrate by passing the deposition material through the first overlap patterning slit, and a second organic layer is deposited on the first organic layer by passing the deposition material through the second overlap patterning slit.

19. The method as claimed in claim 16, wherein a sum of a thickness of a first organic layer and a thickness of a second organic layer corresponds to a thickness of an organic layer deposited through the first patterning slit or the second patterning slit, the first organic layer being deposited on the substrate through the first overlap patterning slit, and the second organic layer being deposited on the first organic layer through the second overlap patterning slit.

20. The method as claimed in claim 16, wherein the deposition assembly forms a pattern layer on the substrate.

* * * * *